(12) United States Patent
Kang et al.

(10) Patent No.: US 12,051,715 B2
(45) Date of Patent: Jul. 30, 2024

(54) DISPLAY DEVICE INCLUDING ELECTRODE PATTERNS COUPLED BY A CONNECTION PATTERN AND REPAIR METHOD THEREFOR

(71) Applicant: Samsung Display Co., Ltd., Yongin-si (KR)

(72) Inventors: Sin Chul Kang, Yongin-si (KR); Su Mi Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 17/417,730

(22) PCT Filed: Jul. 2, 2019

(86) PCT No.: PCT/KR2019/008073
§ 371 (c)(1),
(2) Date: Jun. 23, 2021

(87) PCT Pub. No.: WO2020/138610
PCT Pub. Date: Jul. 2, 2020

(65) Prior Publication Data
US 2022/0077227 A1 Mar. 10, 2022

(30) Foreign Application Priority Data
Dec. 24, 2018 (KR) .................. 10-2018-0168397

(51) Int. Cl.
*H01L 27/15* (2006.01)
*G09G 3/32* (2016.01)
(Continued)

(52) U.S. Cl.
CPC ............. *H01L 27/156* (2013.01); *G09G 3/32* (2013.01); *H01L 33/38* (2013.01); *H01L 33/62* (2013.01); *G09G 2330/08* (2013.01)

(58) Field of Classification Search
CPC .................. H01L 27/156; H01L 33/38; H05K 2201/09236; H05K 2201/09254; G09G 2330/08; G09G 2300/0426
See application file for complete search history.

(56) References Cited

U.S. PATENT DOCUMENTS 7,211,944 B2  5/2007  Bae et al.
7,948,164 B2  5/2011  Bae et al.
(Continued)

FOREIGN PATENT DOCUMENTS

CN  106997731 A  8/2017
CN  107818755 A  3/2018
(Continued)

OTHER PUBLICATIONS

International Search Report for corresponding Application No. PCT/KR2019/008073 dated Oct. 8, 2019, 4pp.

*Primary Examiner* — Lex H Malsawma
*Assistant Examiner* — Bruce R. Smith
(74) *Attorney, Agent, or Firm* — Lewis Roca Rothgerber Christie LLP

(57) ABSTRACT

A display device may include: a base layer including a display area and a non-display area; and a plurality of pixels in the display area, and each including a plurality of sub-pixels each including an emission area configured to emit light and a peripheral area around the emission area. The sub-pixels may include: at least one first electrode and at least one second electrode extending in a direction and spaced apart from each other; and a plurality of light emitting elements between a first electrode of the at least one first electrode and a second electrode of the at least one second electrode and configured to emit light. At least one of the first electrode and the second electrode may include at least two first electrode patterns spaced apart from each (Continued)

other, and coupled by at least one first connection pattern in the emission area.

20 Claims, 25 Drawing Sheets

(51) Int. Cl.
    *H01L 33/38*     (2010.01)
    *H01L 33/62*     (2010.01)

(56) References Cited

U.S. PATENT DOCUMENTS

| | | | |
|---|---|---|---|
| 9,460,656 | B2 | 10/2016 | Shim et al. |
| 10,026,777 | B2 | 7/2018 | Kang et al. |
| 10,339,845 | B2 | 7/2019 | Choi et al. |
| 10,879,223 | B2 | 12/2020 | Do et al. |
| 10,943,967 | B2 | 3/2021 | Kim et al. |
| 2011/0303930 | A1 | 12/2011 | Bang et al. |
| 2014/0319484 | A1 | 10/2014 | Kwon |
| 2016/0148911 | A1* | 5/2016 | Do .............. H05K 1/0295 438/28 |
| 2017/0092166 | A1* | 3/2017 | Choi .............. G09G 3/2003 |
| 2017/0256522 | A1 | 9/2017 | Cok et al. |
| 2018/0175106 | A1 | 6/2018 | Kim et al. |

FOREIGN PATENT DOCUMENTS

| | | |
|---|---|---|
| DE | 103 57 472 A1 | 7/2004 |
| JP | 4397860 B2 | 1/2010 |
| KR | 10-2013-0087894 A | 8/2013 |
| KR | 10-2017-0049117 A | 5/2017 |
| KR | 10-2017-0049283 A | 5/2017 |
| KR | 10-2017-0101334 A | 9/2017 |
| KR | 10-2018-0071465 A | 6/2018 |
| KR | 10-2018-0072909 A | 7/2018 |

* cited by examiner

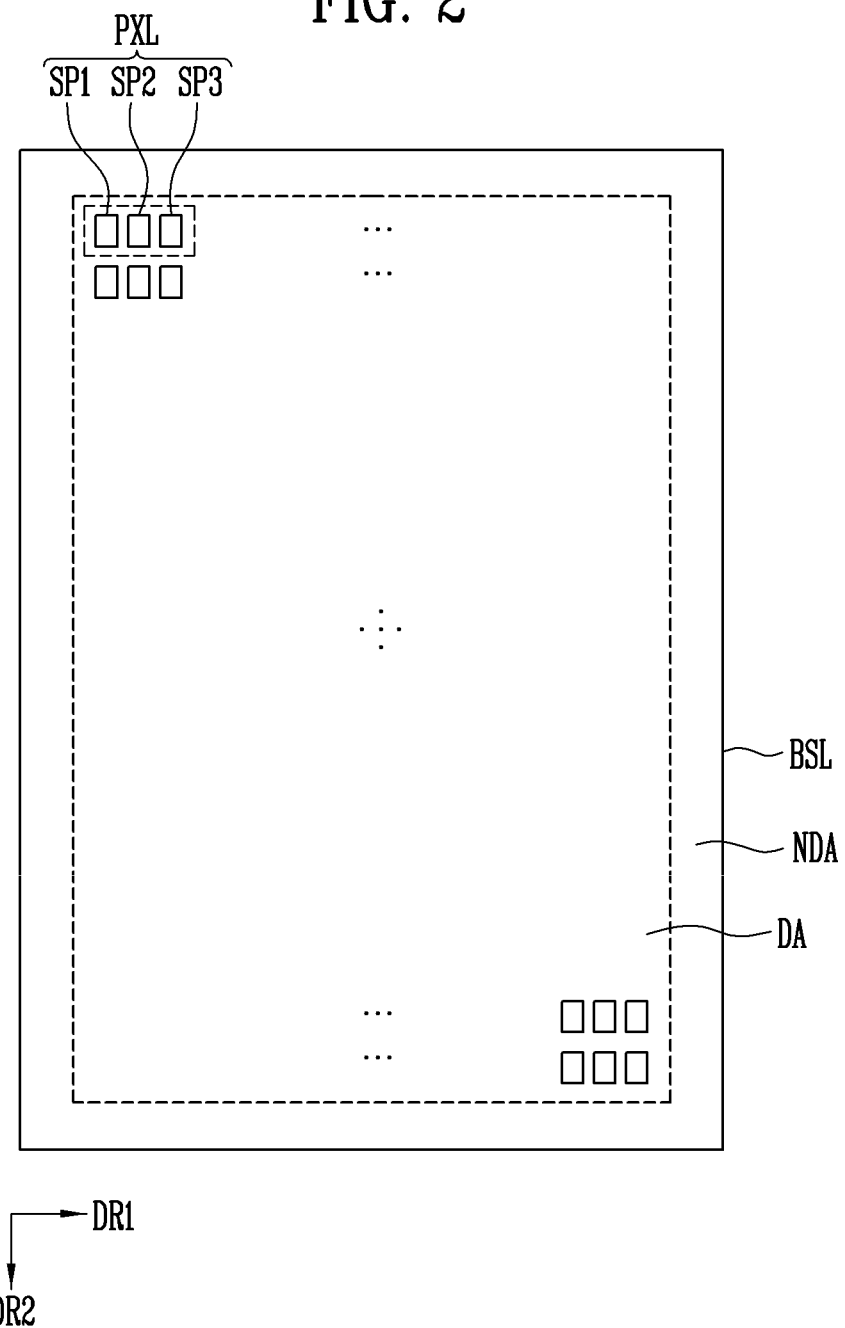

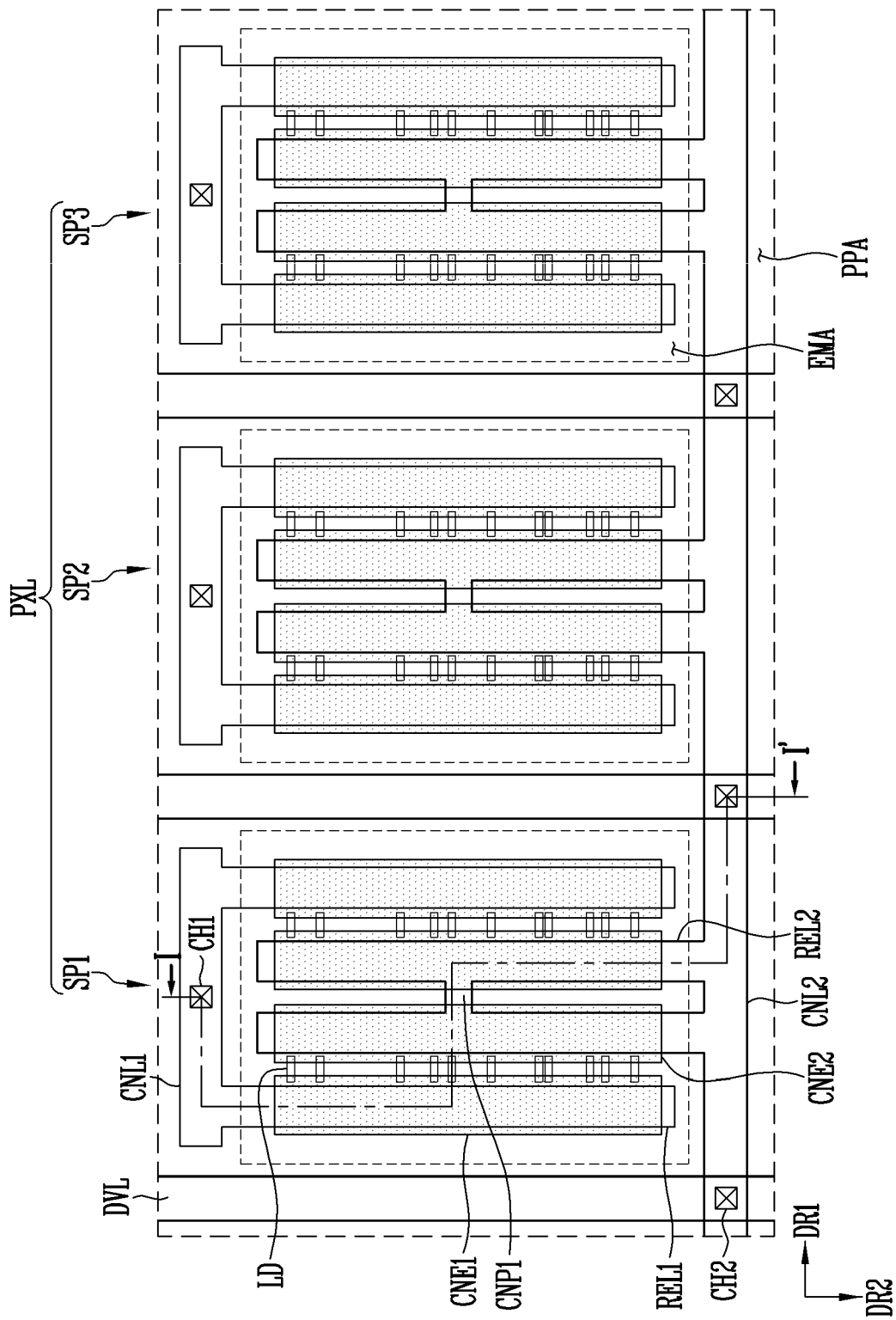

DISPLAY DEVICE INCLUDING ELECTRODE PATTERNS COUPLED BY A CONNECTION PATTERN AND REPAIR METHOD THEREFOR

CROSS-REFERENCE TO RELATED APPLICATIONS

This application is a U.S. National Phase Patent Application of International Patent Application Number PCT/KR2019/008073, filed on Jul. 2, 2019, which claims priority to Korean Patent Application Number 10-2018-0168397, filed on Dec. 24, 2018, the entire content of each of which is incorporated herein by reference.

BACKGROUND

1. Field

Aspects of various embodiments of the present disclosure relate to a display device and a method of repairing the display device.

2. Background Art

A light emitting diode (LED) may have relatively satisfactory durability even under poor environmental conditions, and have excellent performance in terms of lifetime and luminance. Recently, research on the technology of applying such light emitting diodes to various display devices has become substantially more active.

As a part of such research, technologies of fabricating an LED having a small size corresponding to the micrometer scale or the nanometer scale using an inorganic crystalline structure, e.g., a structure obtained by growing a nitride-based semiconductor are being developed.

SUMMARY

According to an aspect of various embodiments of the present disclosure, a display device capable of operating a defective pixel as a normal pixel, and a method of repairing the display device are provided. According to an aspect of various embodiments of the present disclosure, a display device including a subminiature light emitting element and a method of repairing the display device are provided.

A display device in accordance with one or more embodiments of the present disclosure may include: a base layer including a display area and a non-display area; and a plurality of pixels in the display area, and each comprising a plurality of sub-pixels each including an emission area configured to emit light and a peripheral area around the emission area. The sub-pixels may include: at least one first electrode and at least one second electrode extending in a direction and spaced apart from each other; and a plurality of light emitting elements between a first electrode of the at least one first electrode and a second electrode of the at least one second electrode and configured to emit light. At least one of the at least one first electrode and the at least one second electrode may include at least two first electrode patterns spaced apart from each other, and the at least two first electrode patterns may be coupled by at least one first connection pattern in the emission area.

In an embodiment, the first electrode may be between two second electrodes of the at least one second electrode adjacent to each other. The first electrode may include the first electrode patterns.

In an embodiment, the second electrode may be between two first electrodes of the at least one first electrode adjacent to each other. The second electrode may include the first electrode patterns.

In an embodiment, the first connection pattern may be formed integrally with the first electrode patterns.

In an embodiment, the display device may include: a first contact electrode extending along the first electrode, and configured to couple the first electrode with an end of opposite ends of the light emitting element; and a second contact electrode extending along the second electrode, and configured to couple the second electrode with another end of the opposite ends of the light emitting element. At least one of the first contact electrode and the second contact electrode may include at least two second electrode patterns spaced apart from each other, and the second electrode patterns may be coupled by at least one second connection pattern.

In an embodiment, the second connection pattern may be formed integrally with one of the first contact electrode and the second contact electrode.

In an embodiment, the second connection pattern may be formed integrally with the first contact electrode. The first electrode may be between the second connection pattern and the light emitting elements.

In an embodiment, the second connection pattern may be formed integrally with the second contact electrode. The second electrode may be between the second connection pattern and the light emitting elements.

In an embodiment, the first connection pattern and at least a portion of the second connection pattern may overlap with each other.

In an embodiment, the first connection pattern and the second electrode pattern may be spaced apart from each other.

In an embodiment, a number of first connection patterns and a number of second connection patterns may differ from each other.

A display device in accordance with one or more embodiments of the present disclosure may include: a base layer including a display area and a non-display area; and a plurality of pixels in the display area, and each comprising a plurality of sub-pixels each including an emission area configured to emit light and a peripheral area around the emission area. The sub-pixels may include: at least one first electrode and at least one second electrode extending in a direction and spaced apart from each other; a plurality of light emitting elements between the first electrode and the second electrode and configured to emit light; a first contact electrode extending along the first electrode and configured to couple the first electrode with an end of opposite ends of the light emitting element; and a second contact electrode extending along the second electrode, and configured to couple the second electrode with another end of the opposite ends of the light emitting element. At least one of the first electrode and the second electrode may include at least two first electrode patterns spaced apart from each other. At least one of the first contact electrode and the second contact electrode may include at least two second electrode patterns spaced apart from each other, and the second electrode patterns may be coupled by at least one connection pattern in the emission area.

In an embodiment, the connection pattern may be formed integrally with the first contact electrode. The first electrode may be between the connection pattern and the light emitting elements.

In an embodiment, the connection pattern may be formed integrally with the second contact electrode. The second electrode may be between the connection pattern and the light emitting elements.

According to one or more embodiments of the present disclosure a method of repairing a display device is provided. The display device may include: a base layer including a display area and a non-display area; and a plurality of pixels in the display area, and each comprising a plurality of sub-pixels each including an emission area configured to emit light and a peripheral area around the emission area. The pixels may include: a first electrode and a second electrode extending in a direction and spaced apart from each other; and a plurality of light emitting elements between the first electrode and the second electrode and configured to emit light. At least one of the first electrode and the second electrode may include two electrode patterns spaced apart from each other, and the electrode patterns are coupled by at least one connection pattern in the emission area. The method may include separating an electrode pattern of the electrode patterns coupled with a normal light emitting element of the plurality of light emitting elements from the electrode pattern coupled with a defective light emitting element of the plurality of light emitting elements.

In an embodiment, separating the electrode pattern may include, when a contact electrode couples the electrode pattern with one end of opposite ends of the light emitting element, separating the contact electrode coupled to the normal light emitting element of the plurality of light emitting elements from the contact electrode coupled to the defective light emitting element.

In an embodiment, the method may include, when the first electrode includes the electrode patterns, forming a first cutting line on a first contact electrode configured to couple the first electrode with one end of opposite ends of the light emitting element; and forming, on the first contact electrode, a second cutting line to be spaced apart from the first cutting line. A junction between the defective light emitting element and the first contact electrode may be between the first cutting line and the second cutting line.

In an embodiment, the first cutting line and the second cutting line may be formed on the first electrode.

In an embodiment, the method may include, when the second electrode includes the electrode patterns, forming a first cutting line on a second contact electrode configured to couple the second electrode with one end of opposite ends of the light emitting element; and forming, on the second contact electrode, a second cutting line to be spaced apart from the first cutting line. A junction between the defective light emitting element and the second contact electrode may be between the first cutting line and the second cutting line.

In an embodiment, the first cutting line and the second cutting line may be formed on the second electrode.

In a display device and a method of repairing the display device in accordance with various embodiments of the present disclosure, even when a defective light emitting element is present in a sub-pixel, the defective light emitting element may be easily repaired, and the sub-pixel may be normally operated using the other light emitting elements.

DESCRIPTION OF DRAWINGS

FIG. 2 illustrates a display device in accordance with an embodiment of the present disclosure, and is a schematic plan view illustrating a display device using the light emitting element illustrated in FIG. 1 as a light emitting source.

FIG. 4 is a plan view schematically illustrating first to third sub-pixels included in one of the pixels illustrated in FIG. 2 in accordance with an embodiment of the present disclosure.

DETAILED DESCRIPTION

Figure 1:
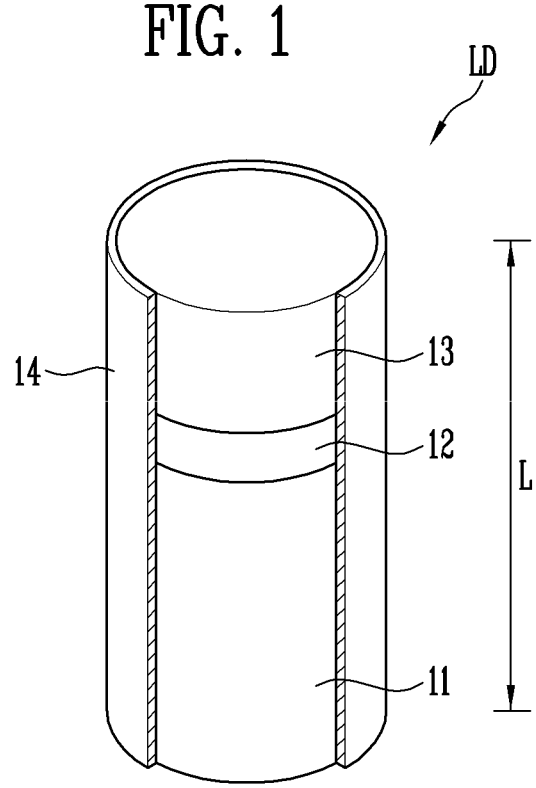
FIG. 1 is a perspective view illustrating a light emitting diode in accordance with an embodiment of the present disclosure.

Like components will be designated by like reference symbols. Further, it is to be understood that the drawings may be exaggerated in thicknesses, ratios, and dimensions of components for purposes of descriptive convenience and clarity. The term "and/or" may include any and all combinations of one or more of the associated listed items.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

Also, the terms "under," "below," "above," "upper," and the like are used herein for explaining relationship between one or more components illustrated in the drawings. These terms may be relative terms describing the positions of components in the drawings.

It is to be further understood that the terms "comprise," "include," "have," etc., when used in this specification, specify the presence of stated features, integers, steps, operations, elements, components, and/or combinations thereof but do not preclude the presence or addition of one or more other features, integers, steps, operations, elements, components, and/or combinations thereof.

FIG. 1 is a perspective view illustrating a light emitting diode in accordance with an embodiment of the present disclosure.

As illustrated in FIG. 1, a light emitting element LD in accordance with an embodiment of the present disclosure may include a first conductive semiconductor layer 11, a second conductive semiconductor layer 13, and an active layer 12 interposed between the first conductive semiconductor layer 11 and the second conductive semiconductor layer 13.

For example, the light emitting element LD may have a structure formed by successively stacking the first conductive semiconductor layer 11, the active layer 12, and the second conductive semiconductor layer 13. The light emitting element LD may be provided in a rod shape extending in a direction. Here, the term "rod shape" may refer to a rod-like shape or a bar-like shape extending in a longitudinal direction (i.e., having an aspect ratio greater than 1).

The light emitting element LD may have a rod shape formed by successively stacking the first conductive semiconductor layer 11, the active layer 12, and the second conductive semiconductor layer 13 in the longitudinal direction of the light emitting element LD, and have one end and another end based on the active layer 12. One of the first and second conductive semiconductor layers 11 and 13 may be disposed on the one end of the light emitting element LD, and the other of the first and second conductive semiconductor layers 11 and 13 may be disposed on the other end.

The light emitting element LD may be fabricated in a small size having a diameter and/or length corresponding to, e.g., a micro-scale or nano-scale size. However, the size of the light emitting element LD in accordance with one or more embodiments of the present disclosure is not limited to this, and the size of the light emitting element LD may be varied to satisfy requirements for the display device to which the light emitting element LD is applied.

The first conductive semiconductor layer 11 may include, for example, at least one n-type semiconductor layer. For example, the first conductive semiconductor layer 11 may include a semiconductor layer which includes any semiconductor material of InAlGaN, GaN, AlGaN, InGaN, AlN, and InN, and is doped with a first conductive dopant, such as Si, Ge, or Sn. However, the material forming the first conductive semiconductor layer 11 is not limited to this, and the first conductive semiconductor layer 11 may be formed of various other materials.

The active layer 12 may be formed on the first conductive semiconductor layer 11 and have a single or multiple quantum well structure. In accordance with an embodiment of the present disclosure, a cladding layer (not shown) doped with a conductive dopant may be formed on and/or under the active layer 12. For example, the cladding layer may be formed of an AlGaN layer or an InAlGaN layer. In addition, a material such as AlGaN or AlInGaN may be used to form the active layer 12.

If an electric field having a certain voltage (e.g., a predetermined voltage) or more is applied to the opposite ends of the light emitting element LD, the light emitting element LD emits light by coupling of electron-hole pairs in the active layer 12.

The second conductive semiconductor layer 13 may be provided on the active layer 12 and include a semiconductor layer of a type different from that of the first conductive semiconductor layer 11. For example, the second conductive semiconductor layer 13 may include at least one p-type semiconductor layer. For example, the second conductive semiconductor layer 13 may include a semiconductor layer which includes any semiconductor material of InAlGaN, GaN, AlGaN, InGaN, AlN, and InN, and is doped with a second conductive dopant, such as Mg. However, the material forming the second conductive semiconductor layer 13 is not limited to this, and the second conductive semiconductor layer 13 may be formed of various other materials.

In accordance with an embodiment of the present disclosure, the light emitting element LD may not only include the first conductive semiconductor layer 11, the active layer 12, and the second conductive semiconductor layer 13, but may also include a fluorescent layer, another active layer, another semiconductor layer, and/or an electrode layer provided on and/or under each layer. For example, the light emitting element LD may include an electrode layer disposed on the second conductive semiconductor layer 13.

The light emitting element LD may further include an insulating film 14. In an embodiment of the present disclosure, the insulating film 14 may be omitted, or may be provided to cover only some of the first conductive semiconductor layer 11, the active layer 12, and the second conductive semiconductor layer 13.

For example, the insulating film 14 may be provided on a portion of the light emitting element LD, other than the opposite ends thereof, such that the opposite ends of the light emitting element LD may be exposed. Although in FIG. 1 there is illustrated the insulating film 14 from which a portion thereof has been removed for the sake of explanation, the light emitting element LD may be formed such that the entirety of the side surface of a cylindrical body thereof is enclosed by the insulating film 14.

The insulating film 14 may be provided to enclose at least a portion of an outer circumferential surface of the first conductive semiconductor layer 11, the active layer 12, and/or the second conductive semiconductor layer 13. For example, the insulating film 14 may be provided to enclose at least the outer circumferential surface of the active layer 12.

In accordance with an embodiment of the present disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but the present disclosure is not limited thereto. That is, various materials having insulating properties may be used.

If the insulating film 14 is provided on the light emitting element LD, the active layer 12 may be prevented or substantially prevented from short-circuiting with a first and/or second electrode (not illustrated).

Due to the insulating film 14, occurrence of a defect on the surface of the light emitting element LD may be minimized or reduced, whereby a lifetime and efficiency of the light emitting element LD may be improved. In a case in which a plurality of light emitting elements LD are disposed in close contact with each other, the insulating film 14 may prevent or substantially prevent an undesired short circuit from occurring between the light emitting elements LD adjacent to each other.

The light emitting element LD may be used as a light source for various display devices. For example, the light emitting element LD may be used in a lighting device or a self-emissive display device.

Herein, a display device including the light emitting element LD in accordance with an embodiment of the present disclosure will be described in further detail.

FIG. 2 illustrates a display device in accordance with an embodiment of the present disclosure, and is a schematic plan view illustrating a display device using the light emitting element illustrated in FIG. 1 as a light emitting source.

For the sake of explanation, FIG. 2 schematically illustrates a structure of the display device, focused on a display area DA on which an image is displayed. In some embodiments, although not illustrated, at least one driving circuit (e.g., a scan driver and a data driver) and/or a plurality of signal lines may be further provided in the display device.

Referring to FIGS. 1 and 2, the display device in accordance with an embodiment of the present disclosure may include a base layer BSL, a plurality of pixels PXL provided on the base layer BSL and each including at least one light emitting element LD, a driver (not illustrated) provided on the base layer BSL and configured to drive the pixels PXL, and a line component (not illustrated) provided to couple the pixels PXL with the driver.

The display device may be classified into a passive-matrix type display device and an active-matrix type display device according to a method of driving the light emitting element LD. In the case in which the display device is implemented as an active matrix type, each of the pixels PXL may include a driving transistor configured to control an amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the present disclosure is not limited thereto. For example, passive-matrix type display devices in which pixels PXL may be turned on by groups may also use components (e.g., first and second electrodes) for driving the light emitting element LD.

The base layer BSL may be a substrate of the display device, and include a display area DA and a non-display area NDA. The display area DA may be an area in which the pixels PXL for displaying an image are provided. The non-display area NDA may be an area in which the driver for driving the pixels PXL and some of the line component for coupling the pixels PXL to the driver are provided.

Although in the drawing there is illustrated an example in which the display area DA is disposed in a central area of the display device and the non-display area NDA is disposed in a perimeter area of the display device to enclose the display area DA, the present disclosure is not limited thereto, and the locations thereof may be varied.

The display area DA may have any of various shapes. For example, the display area DA may be provided in any of various forms, such as a closed polygon including sides formed of linear lines, a circle, an ellipse or the like including a side formed of a curved line, and a semicircle, a semi-ellipse or the like including sides formed of a linear line and a curved line. The non-display area NDA may be provided on at least one side of the display area DA. Although in the drawing there is illustrated a structure in which the non-display area NDA encloses the display area DA, the present disclosure is not limited thereto.

The base layer BSL may be a rigid substrate or a flexible substrate, and the present disclosure is not limited thereto. For example, the base layer BSL may be a rigid substrate made of glass or reinforced glass, or a flexible substrate formed of a thin film made of plastic or metal. Further, the base layer BSL may be a transparent substrate, but is not limited thereto. In addition, the base layer BSL may be a translucent substrate, an opaque substrate, or a reflective substrate.

The pixels PXL may be provided in the display area DA on the base layer BSL. Each of the pixels PXL refers to a smallest unit for displaying an image, and a plurality of pixels may be provided.

Each of the pixels PXL may include a light emitting element LD configured to be driven in response to a scan signal and a data signal. The light emitting element LD may have a small size corresponding to the nanometer scale or the micrometer scale, and be coupled in parallel to light emitting elements LD disposed adjacent thereto. The light emitting element LD may form a light source of the corresponding pixel PXL.

Further, each of the pixels PXL may include a plurality of sub-pixels SP1, SP2, and SP3. For example, each pixel PXL may include a first sub-pixel SP1, a second sub-pixel SP2, and a third sub-pixel SP3 which are configured to emit different colors of light. For instance, the first sub-pixel SP1 may be a red sub-pixel configured to emit red light, the second sub-pixel SP2 may be a green sub-pixel configured to emit green light, and the third sub-pixel SP3 may be a blue sub-pixel configured to emit blue light. However, the color, type, and/or number of sub-pixels that form each pixel PXL are not limited to the foregoing examples.

Although FIG. 2 illustrates that the pixels PXL are disposed in the display area DA in the form of a matrix in a first direction DR1 and a second direction DR2 different from the first direction DR1, the disposition of the pixels PXL may be changed in various ways without being limited to the foregoing example. Further, disposition of the plurality of sub-pixels of each of the pixels PXL may also be changed in various ways.

The driver may provide a driving signal to each pixel PXL through the line component and thus control the operation of the pixel PXL. In FIG. 2, the line component is omitted for the sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

FIGS. 3A to 3D are circuit diagrams illustrating examples of a unit light emitting area of the display device of FIG. 2 in accordance with various embodiments.

Referring to FIGS. 3A to 3D, each of the first to third sub-pixels may be configured of an active pixel. However, the type, the configuration, and/or the driving method of each of the first to third sub-pixels is not particularly limited. For example, each of the first to third sub-pixels may be configured of a pixel of a passive or active display device which can have any of various known structures.

Further, referring to FIGS. 3A to 3D, the first to third sub-pixels may have substantially the same structure or similar structures. Herein, for the sake of convenience, the first sub-pixel of the first to third sub-pixels will be described as a representative example.

Figure 3A:
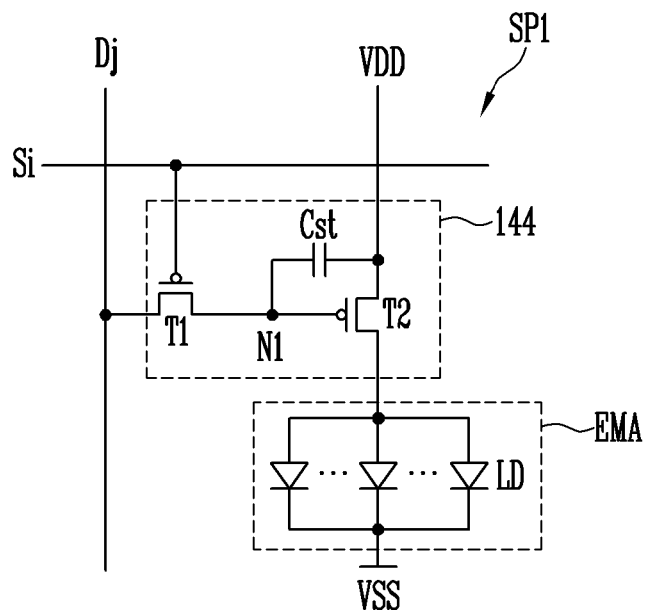
FIGS. 3A to 3D are circuit diagrams illustrating examples of a unit light emitting area of the display device of FIG. 2 in accordance with various embodiments.

Referring to FIGS. 1, 2, and 3A, the first sub-pixel SP1 may include an emission area EMA configured to generate light having a luminance corresponding to a data signal, and a peripheral area disposed around the emission area EMA. Here, a pixel driving circuit 144 for driving the emission area EMA may be disposed in the peripheral area. Although in the drawing the pixel driving circuit 144 and the emission area EMA are illustrated as being separated from each other, a portion of the pixel driving circuit 144 may be disposed in the emission area EMA.

The emission area EMA may include a plurality of light emitting elements LD coupled in parallel to each other between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during an emission period of the first sub-pixel SP1.

A first electrode (e.g., an anode electrode) of each of the light emitting elements LD may be coupled to the first driving power supply VDD via the pixel driving circuit 144. A second electrode (e.g., a cathode electrode) of each of the light emitting elements LD may be coupled to the second driving power supply VSS. Each of the light emitting elements LD may emit light at a luminance corresponding to a driving current that is controlled by the pixel driving circuit 144.

Although FIGS. 3A to 3D illustrate that the light emitting elements LD are coupled in parallel to each other in the same direction (e.g., a forward direction) between the first and second driving power supplies VDD and VSS, the present disclosure is not limited thereto. For example, some of the light emitting elements LD may be coupled to each other in the forward direction between the first and second driving power supplies VDD and VSS, and the other light emitting elements LD may be coupled to each other in the reverse direction.

One of the first and second driving power supplies VDD and VSS may be supplied in the form of an AC voltage. In this case, the light emitting elements LD may alternately emit light by the same connection direction groups. Further, the first sub-pixel SP1 may include only a single light emitting element LD.

The pixel driving circuit 144 may include first and second transistors T1 and T2, and a storage capacitor Cst. However, a structure of the pixel driving circuit 144 is not limited to that of the embodiment illustrated in FIG. 3A.

A first electrode of the first transistor T1 (switching transistor) is coupled to a data line Dj, and a second electrode thereof is coupled to a first node N1. Here, the first electrode and the second electrode of the first transistor T1 may be different electrodes. If the first electrode is a source electrode, the second electrode is a drain electrode. A gate electrode of the first transistor T1 is coupled to a scan line Si.

When a scan signal having a voltage (e.g., a low-level voltage) capable of turning on the first transistor T1 is supplied from the scan line Si, the first transistor T1 is turned on to electrically couple the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first electrode of the second transistor T2 (driving transistor) is coupled to the first driving power supply VDD, and a second electrode of the second transistor T2 (driving transistor) is electrically coupled to the first electrode of each of the light emitting elements LD. A gate electrode of the second transistor T2 is coupled to the first node N1. As such, the second transistor T2 may control the amount of driving current to be supplied to the light emitting elements LD in response to a voltage of the first node N1.

One electrode of the storage capacitor Cst is coupled to the first driving power supply VDD, and the other electrode thereof is coupled to the first node N1. The storage capacitor Cst is charged with a voltage corresponding to a data signal supplied to the first node N1, and maintains the charged voltage until a data signal of a subsequent frame is supplied.

For the sake of explanation, FIG. 3A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the present disclosure is not limited thereto, and the structure of the pixel driving circuit 144 may be changed in various ways. For example, the pixel driving circuit 144 may further include at least one transistor element, such as a transistor element configured to compensate for the threshold voltage of the second transistor T2, a transistor element configured to initialize the first node N1, and/or a transistor element configured to control an emission time of the light emitting elements LD, or other circuit elements, such as a boosting capacitor for boosting the voltage of the first node N1.

Further, although FIG. 3A illustrates that the transistors, e.g., the first and second transistors T1 and T2, included in the pixel driving circuit 144 are formed of P-type transistors, the type of the transistor is not limited thereto. For example, at least one of the first and second transistors T1 and T2 included in the pixel driving circuit 144 may be an N-type transistor.

Figure 3B:
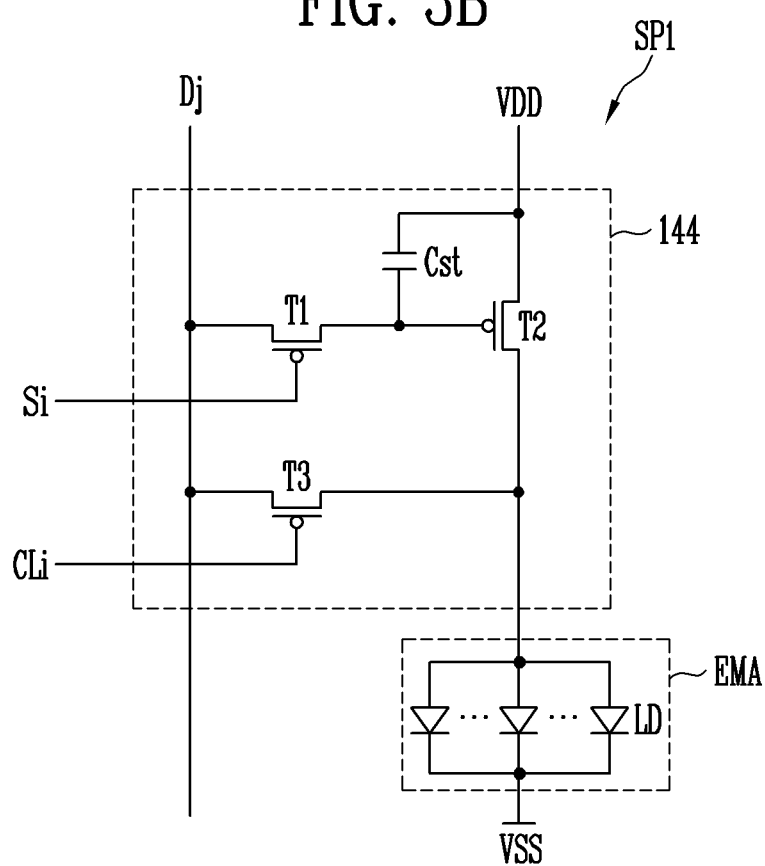

As illustrated in FIG. 3B, the pixel driving circuit 144 may further include a third transistor T3 as well as including the first and second transistors T1 and T2. The third transistor T3 may be coupled between a j-th data line Dj and the anode electrode of each of the light emitting elements LD. The gate electrode of the third transistor T3 may be coupled to a control line CLi such that the third transistor T3 may be turned on when a control signal is supplied to the control line CLi, and be turned off in other cases.

For the sake of convenience, FIG. 3B illustrates that all of the first to third transistors T1 to T3 are formed of P-type transistors, but the present disclosure is not limited thereto. For example, at least one of the first to third transistors T1 to T3 included in the pixel driving circuit 144 may be formed of an N-type transistor, or all of the first to third transistors T1 to T3 may be N-type transistors.

Figure 3C:
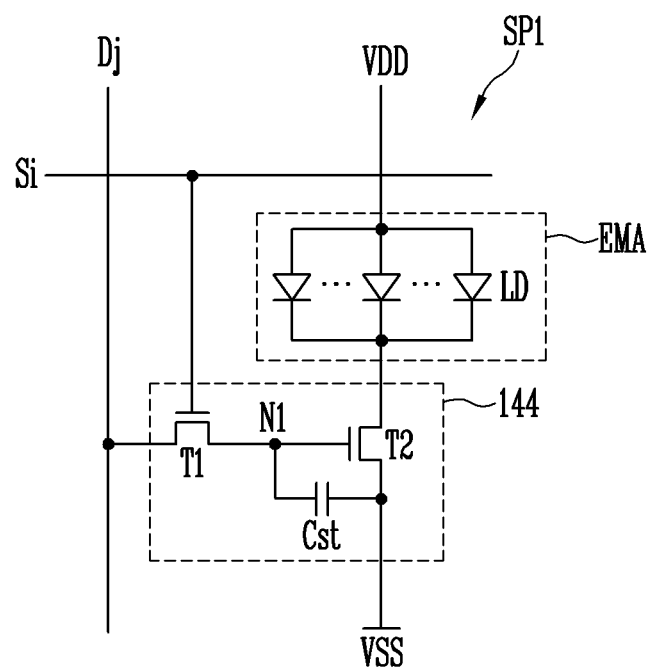

Next, referring to FIGS. 1, 2, and 3C, the first and second transistors T1 and T2 may be N-type transistors. The configuration and operation of the pixel driving circuit 144 illustrated in FIG. 3C, other than a change in connection positions of some components due to a change in the type of transistor, are similar to those of the pixel driving circuit 144 of FIG. 3A. Therefore, further description pertaining to this will be omitted.

Figure 3D:
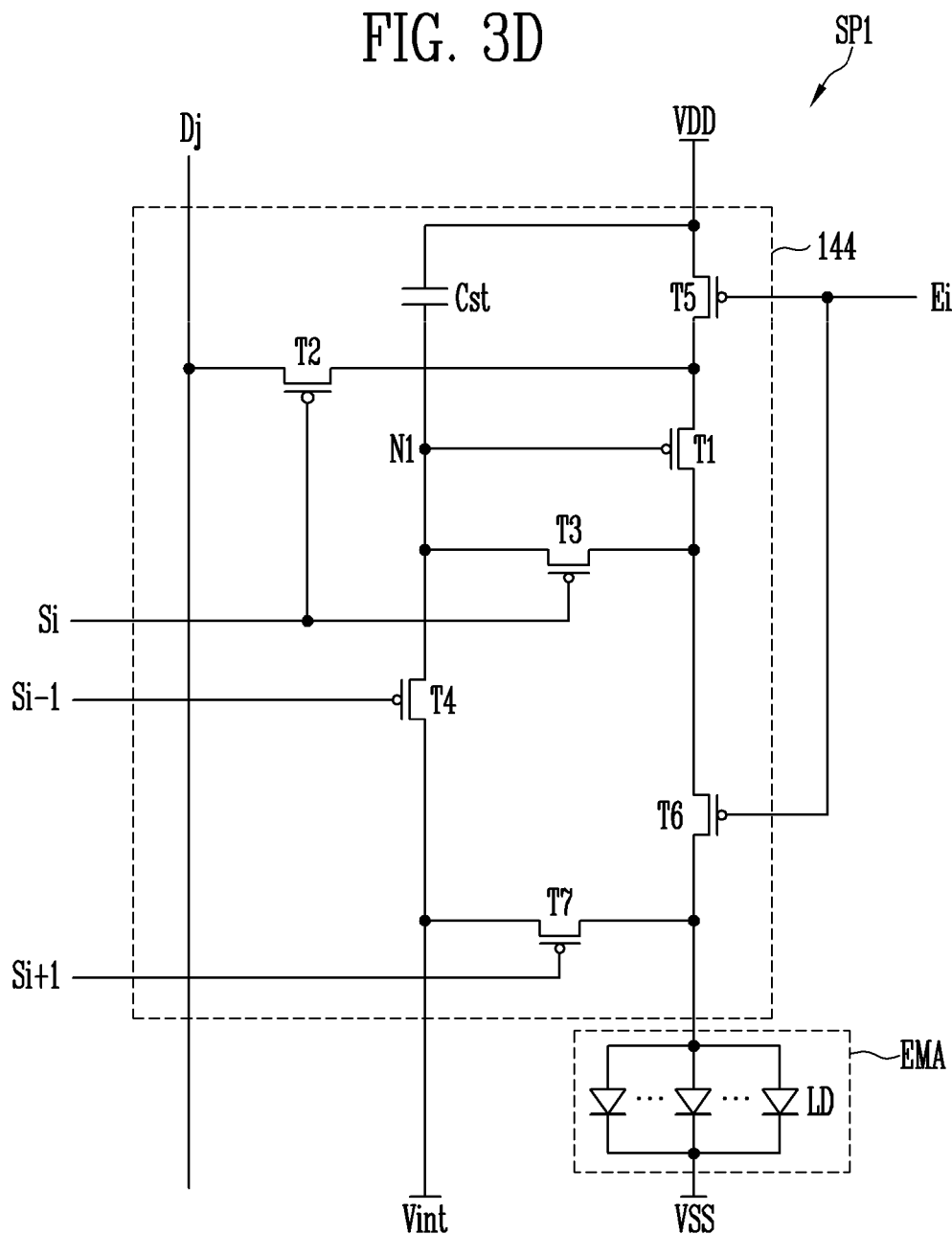

Referring to FIGS. 1, 2, and 3D, the pixel driving circuit 144 may be coupled to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be coupled to an i-th scan line Si and a j-th data line Dj of the display area DA.

Further, the pixel driving circuit 144 may also be coupled to at least one other scan line. For example, the first sub-pixel SP1 disposed on the i-th row of the display area DA may be further coupled to an i−1-th scan line Si−1 and/or an i+1-th scan line Si+1.

The pixel driving circuit 144 may be coupled not only to the first and second driving power supplies VDD and VSS but also to a third power supply. For example, the pixel driving circuit 144 may also be coupled to an initialization power supply Vint.

The pixel driving circuit 144 may include first to seventh transistors T1 to T7, and a storage capacitor Cst.

One electrode of the first transistor T1 (driving transistor), e.g., a source electrode, may be coupled to the first driving power supply VDD via a fifth transistor T5, and the other electrode thereof, e.g., a drain electrode, may be coupled to first end of light emitting elements LD via a sixth transistor T6. A gate electrode of the first transistor T1 may be coupled to a first node N1. The first transistor T1 may control driving current flowing between the first driving power supply VDD and the second driving power supply VSS via the light emitting elements LD in response to a voltage of the first node N1.

The second transistor T2 (switching transistor) may be coupled between the j-th data line Dj coupled to the first sub-pixel SP1 and the source electrode of the first transistor T1. A gate electrode of the second transistor T2 is coupled to the i-th scan line Si coupled to the first sub-pixel SP1. When a scan signal having a gate-on voltage (e.g., a low-level voltage) is supplied from the i-th scan line Si, the second transistor T2 is turned on to electrically couple the j-th data line Dj to the source electrode of the first transistor T1. Hence, if the second transistor T2 is turned on, a data signal supplied from the j-th data line Dj may be transmitted to the first transistor T1.

A third transistor T3 is coupled between the drain electrode of the first transistor T1 and the first node N1. A gate electrode of the third transistor T3 is coupled to the i-th scan line Si. When a scan signal having a gate-on voltage is supplied from the scan line Si, the third transistor T3 is turned on to electrically couple the drain electrode of the first transistor T1 to the first node N1. Therefore, when the third transistor T3 is turned on, the first transistor T1 may be connected in the form of a diode.

A fourth transistor T4 may be coupled between the first node N1 and the initialization power supply Vint. A gate electrode of the fourth transistor T4 is coupled to a previous scan line, e.g., the i−1-th scan line Si−1. When a scan signal of a gate-on voltage is supplied to the i−1-th scan line Si−1, the fourth transistor T4 is turned on such that the voltage of the initialization power supply Vint may be transmitted to the first node N1. Here, the initialization power supply Vint may have a voltage equal to or less than a minimum voltage of the data signal.

The fifth transistor T5 is coupled between the first driving power supply VDD and the first transistor T1. A gate electrode of the fifth transistor T5 is coupled to a corresponding emission control line, e.g., an i-th emission control line Ei. The fifth transistor T5 may be turned off when an emission control signal having a gate-off voltage is supplied to the i-th emission control line Ei, and may be turned on in other cases.

The sixth transistor T6 is coupled between the first transistor T1 and first end of the light emitting elements LD. A gate electrode of the sixth transistor T6 may be coupled to the i-th emission control line Ei. The sixth transistor T6 may be turned off when an emission control signal having a gate-off voltage is supplied to the i-th emission control line Ei, and may be turned on in other cases.

A seventh transistor T7 is coupled between the first end of the light emitting elements LD and the initialization power supply Vint. A gate electrode of the seventh transistor T7 is coupled to any one of scan lines of a subsequent stage, e.g., to the i+1-th scan line Si+1. When a scan signal of a gate-on voltage is supplied to the i+1-th scan line Si+1, the seventh transistor T7 may be turned on such that the voltage of the initialization power supply Vint may be supplied to the first end of the light emitting elements LD.

The storage capacitor Cst is coupled between the first driving power supply VDD and the first node N1. The storage capacitor Cst may store a voltage corresponding both to the data signal applied to the first node N1 during each frame period and to a threshold voltage of the first transistor T1.

For the sake of convenience, FIG. 3D illustrates that all of the first to seventh transistors T1 to T7 are formed of P-type transistors, but the present disclosure is not limited thereto. For example, at least one of the first to seventh transistors T1 to T7 included in the pixel driving circuit 144 may be formed of an N-type transistor, or all of the first to seventh transistors T1 to T7 may be N-type transistors.

Herein, the pixel of the display device of FIG. 2 will be described in further detail with reference to the accompanying drawings.

Figure 5:
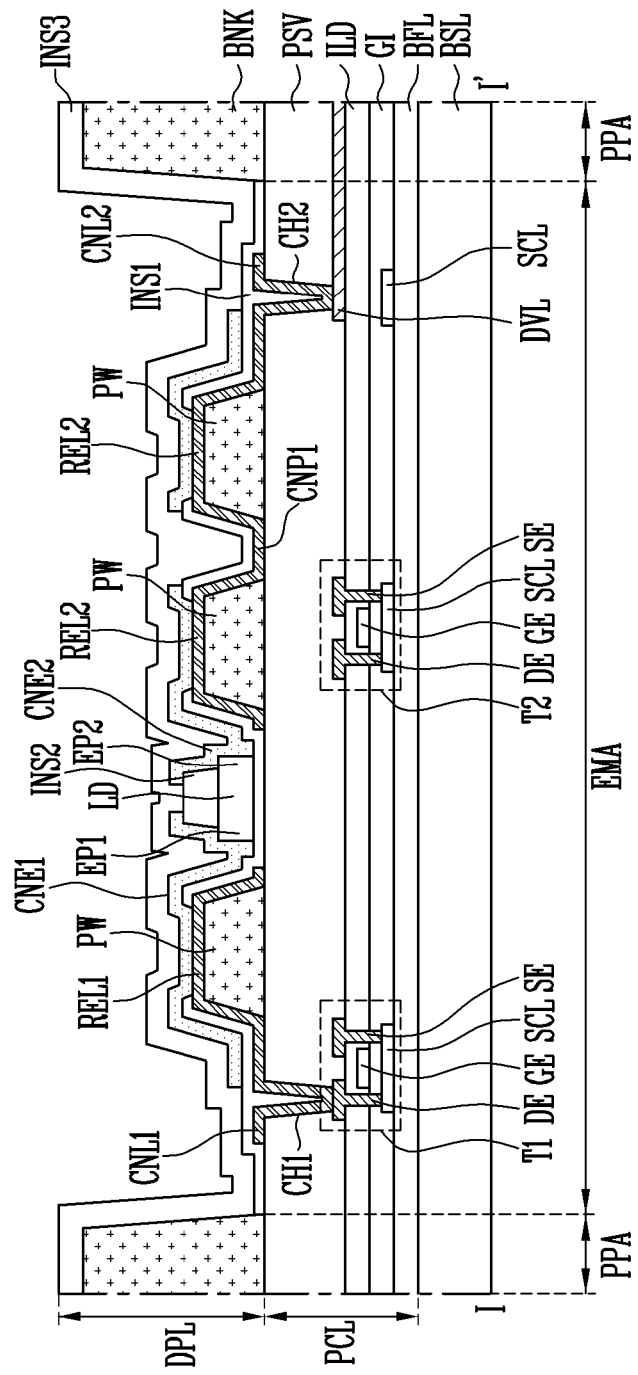
FIG. 5 is a cross-sectional view taken along the line I-I' of FIG. 4.

FIG. 4 is a plan view schematically illustrating first to third sub-pixels included in one of the pixels illustrated in FIG. 2 in accordance with an embodiment of the present disclosure; and FIG. 5 is a cross-sectional view taken along the line I-I' of FIG. 4.

Although, for the sake of explanation, FIG. 4 illustrates that a plurality of light emitting elements LD provided in each sub-pixel are horizontally aligned, the arrangement of the light emitting elements LD is not limited thereto. For example, at least some of the light emitting elements LD may be aligned in a direction intersecting with the horizontal direction. Further, for the sake of explanation, illustration of transistors coupled to the light emitting elements LD, and signal lines coupled to the transistors have been omitted in FIGS. 4 and 5. Further, although FIGS. 4 and 5 illustrate a simplified structure of the one pixel PXL, e.g., showing that each electrode has only a single electrode layer, the present disclosure is not limited thereto.

Referring to FIGS. 1 to 5, the display device in accordance with an embodiment of the present disclosure may include a base layer BSL on which a plurality of pixels PXL are provided.

Each of the pixels PXL may include a first sub-pixel SP1, a second sub-pixel SP2, and a third sub-pixel SP3 which are provided on the base layer BSL. In an embodiment of the present disclosure, the first sub-pixel SP1 may be a red sub-pixel configured to emit red light, the second sub-pixel SP2 may be a green sub-pixel configured to emit green light, and the third sub-pixel SP3 may be a blue sub-pixel configured to emit blue light. However, the color, type, and/or number of sub-pixels that form each pixel PXL are not limited to the foregoing examples.

Each of the first to third sub-pixels SP1 to SP3 may include an emission area EMA configured to emit light, and a peripheral area PPA disposed around a perimeter of the emission area EMA.

Each of the first to third sub-pixels SP1 to SP3 may include a base layer BSL, a pixel circuit layer PCL, and a display element layer DPL.

The pixel circuit layer PCL may include a buffer layer BFL disposed on the base layer BSL, first and second transistors T1 and T2 disposed on the buffer layer BFL, and a driving voltage line DVL. Further, the pixel circuit layer PCL of each of the first to third sub-pixels SP1 to SP3 may further include a passivation layer PSV which is disposed on the first and second transistors T1 and T2 and the driving voltage line DVL.

The base layer BSL may be a rigid or flexible substrate, and the material or properties thereof are not particularly limited. For example, the base layer BSL may be a rigid substrate made of glass or reinforced glass, or a flexible substrate formed of a thin film made of plastic or metal. In addition, the base layer BSL may be a transparent substrate, but the present disclosure is not limited thereto, and the base layer BSL may be a translucent substrate, an opaque substrate, or a reflective substrate. Further, although in the drawings there is illustrated a case in which the base layer BSL has a single-layer structure, the base layer BSL may have a multilayer structure.

The buffer layer BFL may prevent or substantially prevent impurities from being diffused into the first and second transistors T1 and T2. However, the buffer layer BFL may be omitted depending on the material of the substrate SUB or processing conditions.

The first transistor T1 may be electrically coupled with some of the light emitting elements LD provided on the display element layer DPL of the corresponding sub-pixel. In this case, the first transistor T1 may be a driving transistor configured to drive the light emitting elements LD. The second transistor T2 may be a switching transistor configured to switch the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the source area and the drain area may be a semiconductor pattern doped with an impurity.

The gate electrode GE may be provided on the semiconductor layer SCL with a gate insulating layer GI interposed therebetween. The source electrode SE and the drain electrode DE may respectively come into contact with the source area and the drain area of the semiconductor layer SCL through corresponding contact holes which pass through an interlayer insulating layer ILD and the gate insulating layer GI.

In the drawings, although the first and second transistors T1 and T2 are LTPS thin-film transistors, the first and second transistors T1 and T2 are not limited thereto.

Further, although in the drawings the driving voltage line DVL is illustrated as being disposed on the interlayer insulating layer ILD, the location of the driving voltage line DVL is not limited thereto. For example, the driving voltage line DVL may be disposed on any of insulating layers included in the pixel circuit layer PCL. The second driving power supply (refer to VSS of FIG. 3A) may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL.

The display element layer DPL may be disposed on the pixel circuit layer PCL. The display element layer DPL may include a wall PW, a bank BNK, first and second electrodes REL1 and REL2, first and second connection lines CNL1 and CNL2, a plurality of light emitting elements LD, first and second contact electrodes CNE1 and CNE2, etc.

The wall PW may be provided on the passivation layer PSV in the emission area EMA of each of the first to third sub-pixels SP1 to SP3. A bank BNK formed of a same material as that of the wall PW may be formed and/or provided between adjacent sub-pixels to define the emission area EMA of each sub-pixel.

The adjacent walls PW may be disposed on the passivation layer PSV and spaced apart from each other by a length L of a light emitting element LD or more. The light emitting elements LD may be disposed between the adjacent walls PW in the emission area EMA.

In an embodiment, the wall PW may include a curved surface having a cross-sectional shape such as a semicircle, or a semi-ellipse which is reduced in width upward from a surface of the passivation layer PSV. In the drawings, the wall PW is illustrated as having a trapezoidal cross-section. In a cross-sectional view, the shape of the walls PW is not limited to the foregoing examples, and may be changed in various ways within a range in which the efficiency of light emitted from each of the light emitting elements LD can be enhanced.

The bank BNK may be further disposed on the passivation layer PSV. The bank BNK may be disposed in the peripheral area PPA between the adjacent sub-pixels SP1 to SP3 and define the emission area EMA of each of the sub-pixels SP1 to SP3. The bank BNK may prevent or substantially prevent light emitted from the sub-pixels SP1 to SP3 from traveling to the adjacent sub-pixels SP1 to SP3.

The wall PW and the bank BNK may be formed of a same material on a same layer. For example, although the wall PW and the bank BNK may be formed of an organic insulating material including an organic material, the present disclosure is not limited thereto.

The first connection line CNL1 may be electrically coupled with the pixel circuit layer PCL through the first contact hole CH1 formed in the passivation layer PSV. In further detail, the first connection line CNL1 may be connected with a portion of the drain electrode DE of the first transistor T1 of the pixel circuit layer PCL. Although in the drawings the first contact hole CH1 is illustrated as being formed in the peripheral area PPA, the first contact hole CH1 may be formed in the emission area EMA.

The first connection line CNL1 may extend from each of the first to third sub-pixels SP1 to SP3 in the first direction DR1. To independently drive each of the first to third sub-pixels SP1 to SP3, one first connection line CNL1 may be provided in each sub-pixel.

The second connection line CNL2 may also be electrically coupled with the pixel circuit layer PCL through the second contact hole CH2 formed in the passivation layer PSV. In further detail, the second connection line CNL2 may be connected with a portion of the driving voltage line DVL of the pixel circuit layer PCL.

In an embodiment, the second connection line CNL2 may extend in a direction parallel to a direction in which the first connection line CNL1 extends. The second connection line CNL2 may be provided in common to the first to third sub-pixels SP1 to SP3. Therefore, the first to third sub-pixels SP1 to SP3 may be coupled in common to the second connection line CNL2.

Each of the first and second electrodes REL1 and REL2 may be provided in the emission area EMA of each of the first to third sub-pixels SP1 to SP3 and extend in the second direction DR2 intersecting with the first direction DR1. In an embodiment, the first and second electrodes REL1 and REL2 may be provided on a same plane and spaced apart from each other by a distance (e.g., a predetermined distance).

Although in the drawings there is illustrated a case in which two first and second electrodes REL1 and REL2 are disposed in each of the sub-pixels SP1 to SP3, one or more first and second electrodes REL1 and REL2 may be disposed in each of the sub-pixels SP1 to SP3. In an embodiment, in a case in which a plurality of first and second electrodes REL1 and REL2 are disposed, the first and second electrodes REL1 and REL2 may be alternately disposed.

The first electrode REL1 may be coupled to the first connection line CNL1. For example, the first electrode REL1 may be integrally coupled with the first connection line CNL1. In the drawings, there is illustrated a case in which the first electrode REL1 diverges from the first connection line CNL1 in the second direction DR2. Although in the drawings there is illustrated a case in which the first electrode REL1 has two first electrode patterns, the number of first electrodes REL1 and the number of first electrode patterns are not limited thereto.

In the case in which the first electrode REL1 and the first connection line CNL1 are formed and/or provided integrally with each other, the first connection line CNL1 may be regarded as one area of the first electrode REL1. However, the present disclosure is not limited thereto. For example, in some embodiments, the first electrode REL1 and the first connection line CNL1 may be individually formed and electrically coupled to each other through a contact hole, via hole, or the like, which is not illustrated.

The first electrode REL1 may be disposed adjacent to one end of opposite ends EP1 and EP2 of each of the light emitting elements LD. In the drawings, there is illustrated a case in which the first electrode REL1 is disposed adjacent to a first end EP1 of the light emitting elements LD, and the first electrode REL1 is electrically coupled to the first end EP1 of the light emitting elements LD through the first contact electrode CNE1. Therefore, a signal of the first transistor T1 that is applied to the first electrode REL1 may be transmitted to each of the light emitting elements LD through the first contact electrode CNE1.

The second electrode REL2 may be coupled to the second connection line CNL2. For example, the second electrode REL2 may be integrally coupled with the second connection line CNL2. Although in the drawings there is illustrated a case in which the second connection line CNL2 extends in the first direction DR1 and the second electrode REL2 has two first electrode patterns, the number of second electrodes REL2 and the number of first electrode patterns are not limited thereto.

In the case in which the second electrode REL2 and the second connection line CNL2 are formed and/or provided integrally with each other, the second connection line CNL2 may be regarded as one area of the second electrode REL2. However, the present disclosure is not limited thereto. For example, in some embodiments, the second electrode REL2 and the second connection line CNL2 may be individually formed and electrically coupled to each other through a contact hole, via hole, or the like, which is not illustrated.

The second electrode REL2 may be disposed adjacent to the other end of the opposite ends EP1 and EP2 of each of the light emitting elements LD. In the drawings, there is illustrated a case in which the second electrode REL2 is electrically coupled to the second end EP2 of the light emitting elements LD through the second contact electrode CNE2. Hence, the voltage of the second driving power supply VSS applied to the second electrode REL2 may be transmitted to each of the light emitting elements LD.

Each of the first and second electrodes REL1 and REL2 may function as an alignment electrode for aligning the light emitting elements LD in the emission area EMA of each of the first to third sub-pixels SP1 to SP3.

In further detail, before the light emitting elements LD are aligned in the emission area EMA of each of the first to third sub-pixels SP1 to SP3, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels. As alignment voltages (e.g., predetermined alignment voltages) having different voltage levels are respectively applied to the first electrode REL1 and the second electrode REL2, an electric field may be formed between the first electrode REL1 and the second electrode REL2. Hence, the light emitting elements LD may be aligned between the first electrode REL1 and the second electrode REL2.

In an embodiment, in a plan view, in each sub-pixel, the second electrodes REL2 and the first electrodes REL1 may be alternately disposed. In the drawings, there is illustrated a case in which the second electrode REL2 is disposed between the first electrodes REL1.

After the light emitting elements LD are aligned in the emission area EMA of each of the first to third sub-pixels SP1 to SP3, each of the first and second electrodes REL1 and REL2 may function as a driving electrode for driving the light emitting elements LD.

The first and second electrodes REL1 and REL2 provided on the wall PW may be made of material having a reflectivity (e.g., a predetermined reflectivity) to allow light emitted from the opposite ends EP1 and EP2 of each of the light emitting elements LD to travel in a direction (e.g., in a frontal direction) in which an image of the display device is displayed. In this case, the first and second electrodes REL1 and REL2 may function as reflectors for enhancing the efficiency of light emitted from the light emitting elements LD.

In further detail, the first and second electrodes REL1 and REL2, and the first and second connection lines CNL1 and CNL2 may be formed of a conductive material having a reflectivity (e.g., a predetermined reflectivity). A metal, for example, any of Ag, Mg, Al, Pt, Pd, Au, Ni, Nd, Ir, Cr, Ti, and an alloy thereof may be used as the conductive material. However, the materials of the first and second electrodes REL1 and REL2, and the first and second connection lines CNL1 and CNL2 are not limited to the foregoing materials.

Although in the drawings there is illustrated a case in which each of the first and second electrodes REL1 and REL2 and the first and second connection lines CNL1 and CNL2 has a single layer structure, a multilayer structure thereof may be formed by stacking two or more materials among metals, alloys, conductive oxides, and conductive polymers.

Any one of the first and second electrodes REL1 and REL2 may be an anode electrode, and the other may be a cathode electrode. In an embodiment of the present disclosure, the first electrode REL1 may be an anode electrode, and the second electrode REL2 may be a cathode electrode.

In an embodiment of the present disclosure, at least one first connection pattern CNP1 may be disposed in the emission area EMA. The at least one first connection pattern CNP1 may couple two first electrode patterns spaced apart from each other. For example, at least one first connection pattern CNP1 may couple the first electrode patterns of the first electrode REL1 or the first electrode patterns of the second electrode REL2. In the drawings, there is illustrated a case in which at least one first connection pattern CNP1 couples the first electrode patterns of the second electrode REL2.

The first connection pattern CNP1 may be spaced apart from the second connection line CNL2 and be disposed in the emission area EMA of each of the sub-pixels SP1 to SP3. In an embodiment, the first connection pattern CNP1 may be integrally formed with the second electrode REL2.

When a defect is caused by some light emitting elements of the plurality of light emitting elements LD disposed in each of the sub-pixels and the sub-pixel is repaired, the first connection pattern CNP1 may function to minimize or reduce a non-emission area of the sub-pixel.

For example, in a case in which a defective light emitting element is detected, a portion of the second electrode REL2 that is coupled to the defective light emitting element may be disconnected (open). In this case, even when the portion of the second electrode REL2 is disconnected (open), the other light emitting elements LD are coupled with the second electrode REL2 by the first connection pattern CNP1 and thus may be normally operated.

Each of the light emitting elements LD may be formed of a light emitting diode which is made of material having an inorganic crystal structure and has a subminiature size, e.g., corresponding to the nanoscale or the microscale.

Although at least two or tens of light emitting elements LD are provided in the emission area EMA of each of the first to third sub-pixels SP1 to SP3, the present disclosure is not limited thereto. In an embodiment, the number of light emitting elements LD provided in each sub-pixel may be changed in various ways.

Each of the light emitting elements LD may include a stacked emission pattern formed by successively stacking a first conductive semiconductor layer 11, an active layer 12, and a second conductive semiconductor layer 13 in the longitudinal direction of each light emitting element LD. Further, each of the light emitting elements LD may further include an insulating film 14 which encloses an outer circumferential surface of the stacked emission pattern. In an embodiment of the present disclosure, each of the light emitting elements LD may have a cylindrical shape. In this case, each light emitting element LD may have a first end EP1 corresponding to any one of a lower portion of the cylinder and an upper portion of the cylinder, and a second end EP2 corresponding to the other of the lower portion of the cylinder and the upper portion of the cylinder. Any one of the first conductive semiconductor layer 11 and the second conductive semiconductor layer 13 may be disposed on the first end EP1 of each light emitting element LD, and the other of the first conductive semiconductor layer 11 and the second conductive semiconductor layer 13 may be disposed on the second end EP2 thereof.

In an embodiment of the present disclosure, the light emitting elements LD may be aligned between the first electrode REL1 and the second electrode REL2. A second insulating layer INS2 may be provided on the light emitting elements LD to cover a portion of an upper surface of each of the light emitting elements LD. A first insulating layer INS1 may be provided between each of the light emitting elements LD and the passivation layer PSV.

The first insulating layer INS1 may be filled into a space between the passivation layer PSV and each of the light emitting elements LD to stably support the light emitting elements LD and prevent or substantially prevent the light emitting elements LD from being removed from the passivation layer PSV. The first insulating layer INS1 may be formed of an inorganic insulating layer including an inorganic material, or an organic insulating layer including an organic material. Although, in an embodiment of the present disclosure, the first insulating layer INS1 may be formed of inorganic insulating layer that may protect the light emitting elements LD from the pixel circuit layer PCL, the present disclosure is not limited thereto. In an embodiment, the first insulating layer INS1 may be formed of an organic insulating layer that may planarize support surfaces of the light emitting elements LD.

The second insulating layer INS2 may be disposed on the light emitting elements LD. The second insulating layer INS2 may be an organic insulating layer including an organic material. In an embodiment of the present disclosure, the second insulating layer INS2 may be provided on a portion of the upper surface of each of the light emitting elements LD such that the opposite ends EP1 and EP2 of each of the light emitting elements LD may be exposed to the outside. The first and second contact electrodes CNE1 and CNE2 may be coupled to the exposed opposite ends EP1 and EP2 of the light emitting elements LD.

In an embodiment, the first and second contact electrodes CNE1 and CNE2 may be provided on a same plane, and may be spaced apart from each other by a distance (e.g., a predetermined distance) on the second insulating layer INS2 and thus electrically and/or physically separated from each other. In other words, the first contact electrode CNE1 and the second contact electrode CNE2 may be provided on a same layer and formed through a same fabricating process. In an embodiment, the first and second contact electrodes CNE1 and CNE2 may be provided on different layers.

The first and second contact electrodes CNE1 and CNE2 may be coupled with the first and second electrodes REL1 and REL2 exposed from the first insulating layer INS1. The first and second contact electrodes CNE1 and CNE2 along with the first and second electrodes REL1 and REL2 may be disposed on the wall PW. In other words, as described above, the first and second contact electrodes CNE1 and CNE2 may extend in a direction in which the first and second electrodes REL1 and REL2 extend, and may respectively overlap with the first and second electrodes REL1 and REL2 on the corresponding walls PW.

In other words, the first contact electrode CNE1 may include second electrode patterns respectively coupled with the first electrode patterns of the first electrode REL1. The second contact electrode CNE2 may also include second electrode patterns respectively coupled with the first electrode patterns of the second electrode REL2.

The first and second contact electrodes CNE1 and CNE2 may be formed of transparent conductive material to allow light emitted from the light emitting elements LD to travel in the frontal direction of the display device by the first and second electrodes REL1 and REL2.

A third insulating layer INS3 for covering the first and second contact electrodes CNE1 and CNE2 may be provided on the first and second contact electrodes CNE1 and CNE2. The third insulating layer INS3 may prevent or substantially prevent the first and second contact electrodes CNE1 and CNE2 from being exposed to the outside, thus preventing or substantially preventing the first and second contact electrodes CNE1 and CNE2 from being corroded.

The third insulating layer INS3 may be formed of an inorganic insulating layer including an inorganic material, or an organic insulating layer including an organic material. Although the third insulating layer INS3 may have a single layer structure as shown in the drawing, the present disclosure is not limited thereto. For example, the third insulating layer INS3 may have a multilayer structure. In the case in which the third insulating layer INS3 has a multilayer structure, the third insulating layer INS3 may have a structure formed by alternately stacking a plurality of inorganic insulating layers and a plurality of organic insulating layers. For example, the third insulating layer INS3 may have a structure formed by sequentially stacking a first inorganic insulating layer, an organic insulating layer, and a second inorganic insulating layer.

As described above, the opposite ends EP1 and EP2 of the light emitting elements LD may be respectively coupled to the first electrode REL1 and the second electrode REL2 through the first and second contact electrodes CNE1 and CNE2 such that voltages (e.g., predetermined voltages) can be respectively applied to the opposite ends EP1 and EP2, and each of the light emitting elements LD can emit light by coupling of electron-hole pairs in the active layer 12 of the light emitting element LD. In an embodiment, the active layer 12 may emit light having a wavelength range from 400 nm to 900 nm. However, the wavelength range of light emitted from the active layer 12 is not limited thereto, and may be changed in various ways.

As described above, in a display device in accordance with the present disclosure, the first electrode patterns of the second electrode REL2 may be coupled to each other through at least one first connection pattern CNP1, such that even when some light emitting elements LD are defective, the number of light emitting elements LD that do not emit light can be minimized or reduced.

Here, the first connection pattern CNP1 may be formed in various shapes and couple the first electrode patterns of the second electrode REL2 to each other.

Figure 6A:
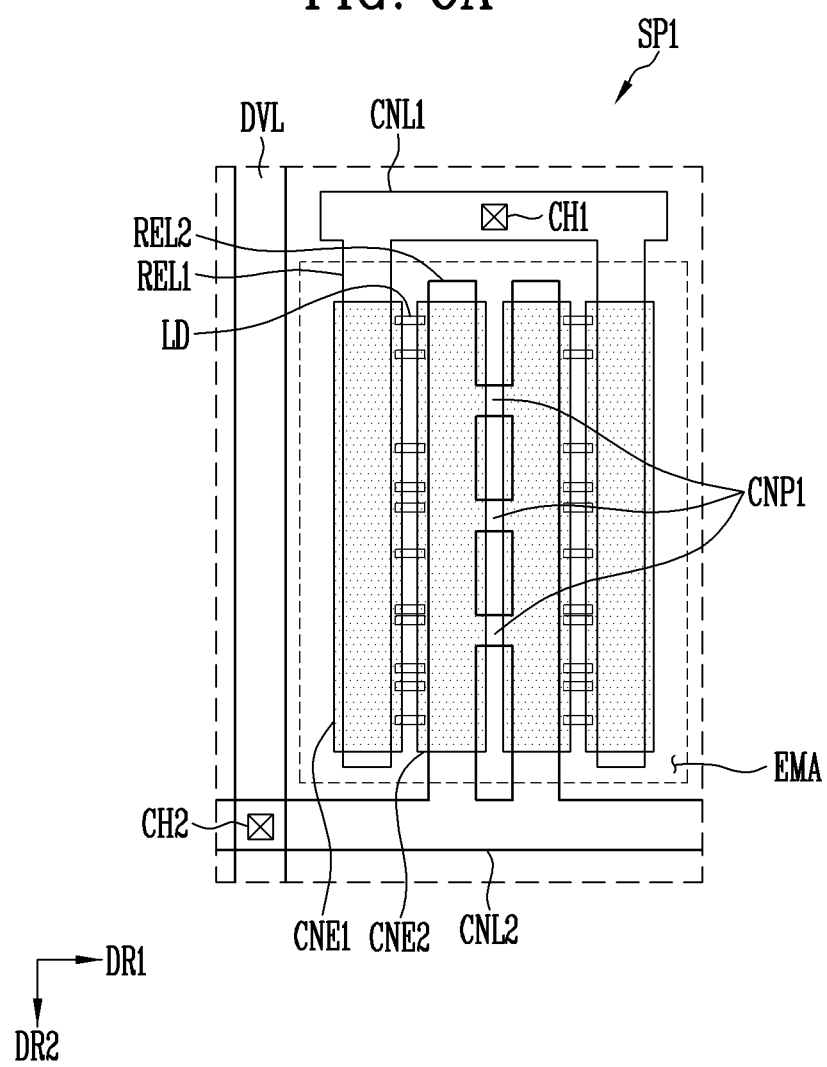
FIGS. 6A to 6C are plan views of a sub-pixel of FIG. 4 showing various shapes of a first connection pattern.
Figure 6B:
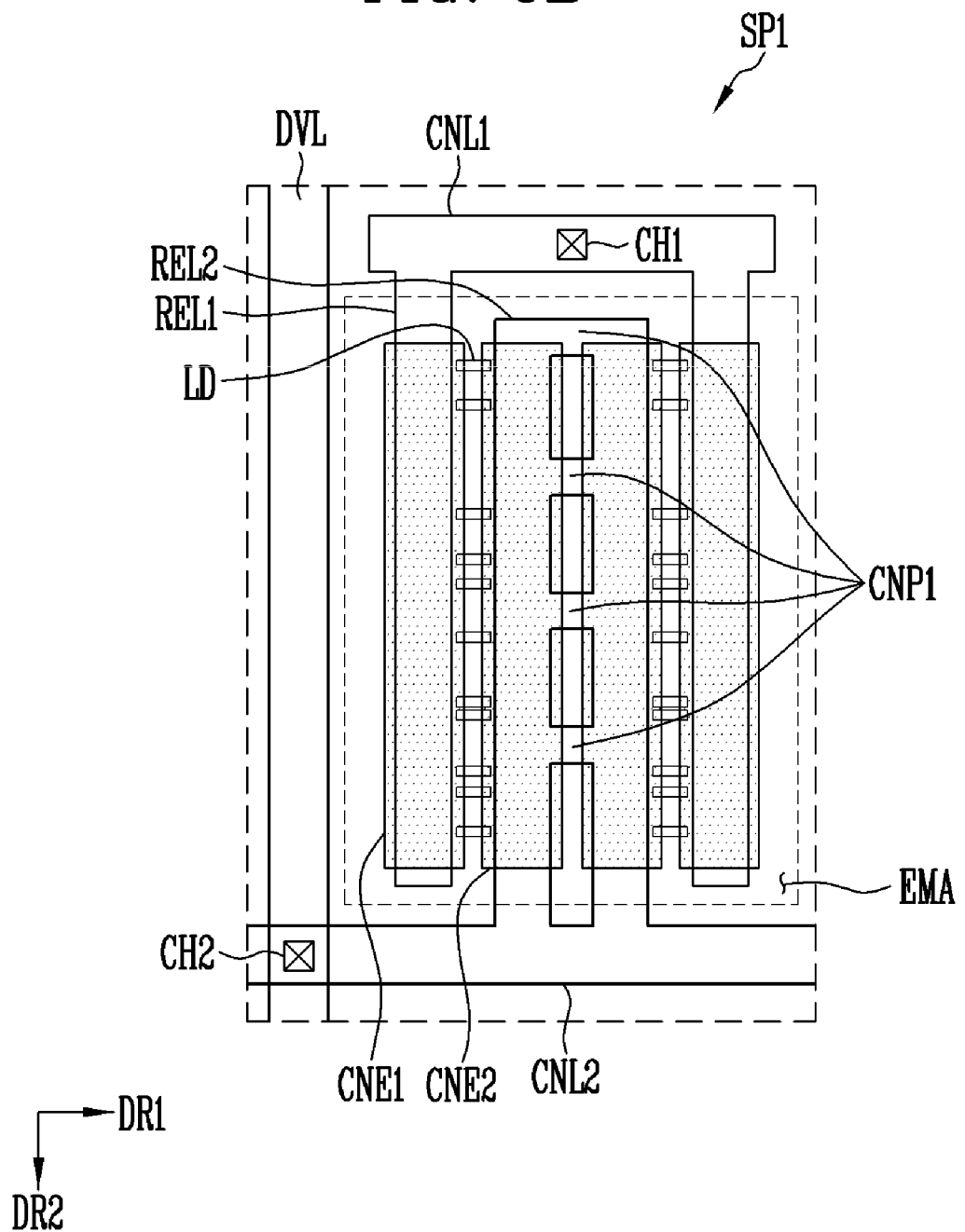
Figure 6C:
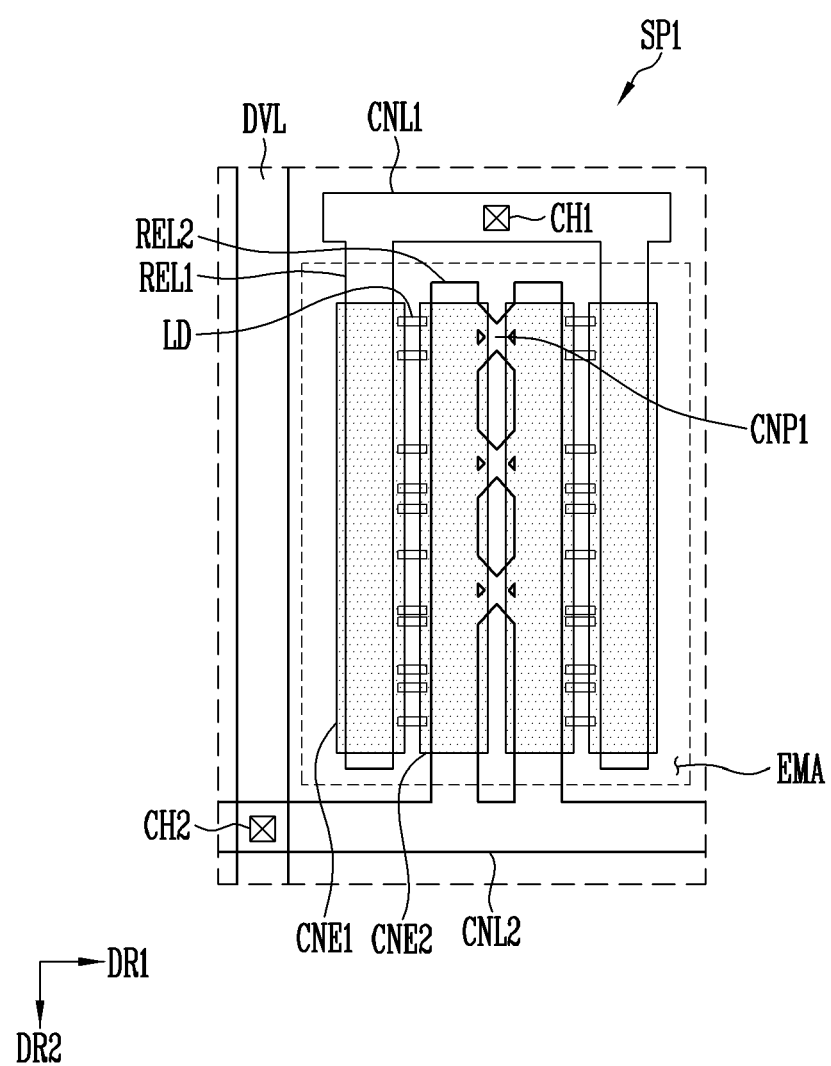

FIGS. 6A to 6C are plan views of the sub-pixel of FIG. 4 showing various shapes of the first connection pattern.

As illustrated in FIGS. 6A to 6C, the first electrode patterns of the second electrode REL2 may be coupled to each other through a plurality of first connection patterns CNP1. The plurality of first connection patterns CNP1 may be disposed in a direction perpendicular to a direction in which the second electrodes REL2 extend, as illustrated in FIGS. 6A and 6B, or may be disposed in a diagonal direction, as illustrated in FIG. 6C.

The second electrode patterns of one of the first contact electrode CNE1 and the second contact electrode CNE2 may be coupled through at least one second connection pattern CNP2.

Figure 7:
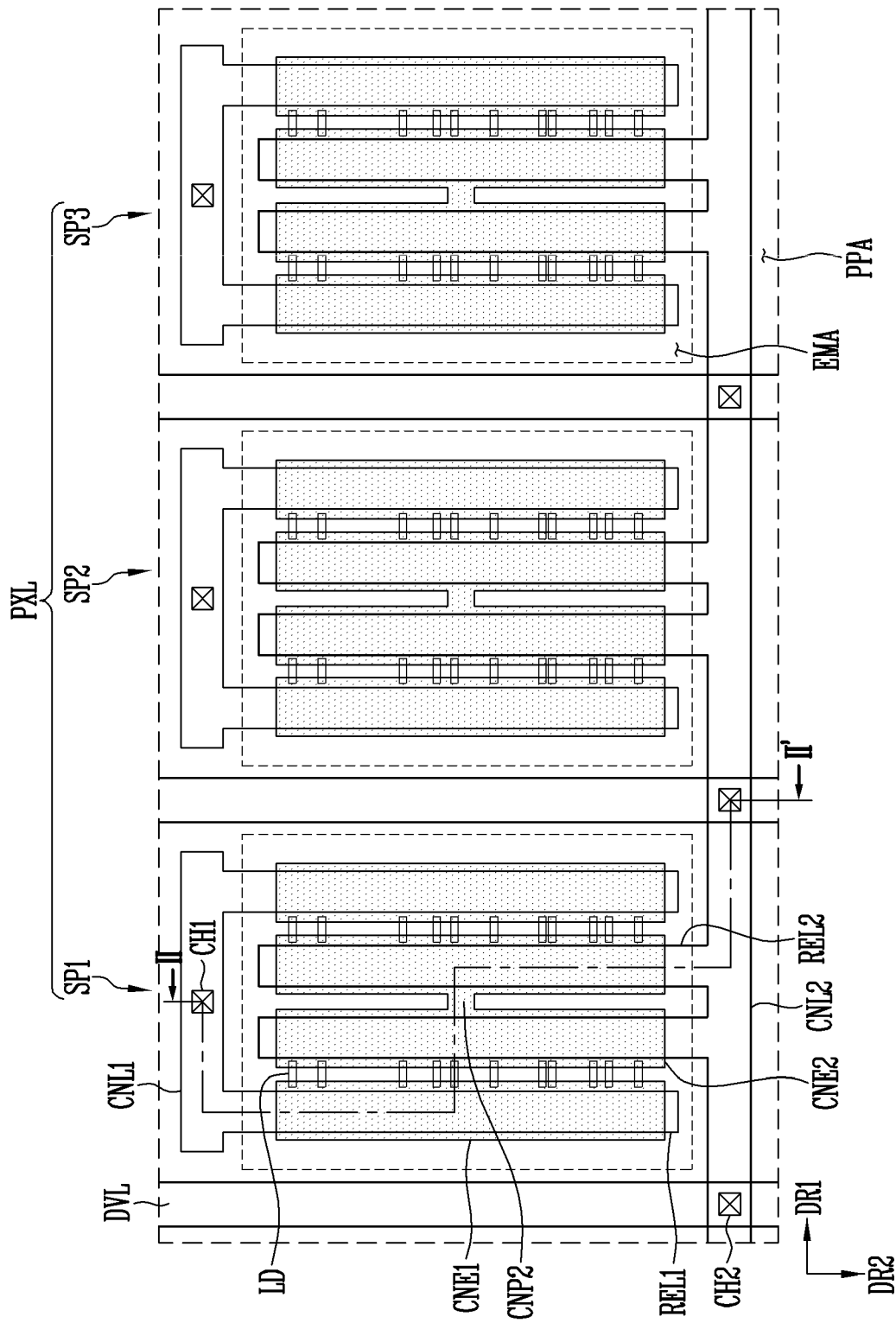
FIG. 7 is a plan view schematically illustrating first to third sub-pixels included in one of the pixels illustrated in FIG. 2 in accordance with another embodiment of the present disclosure.
Figure 8:
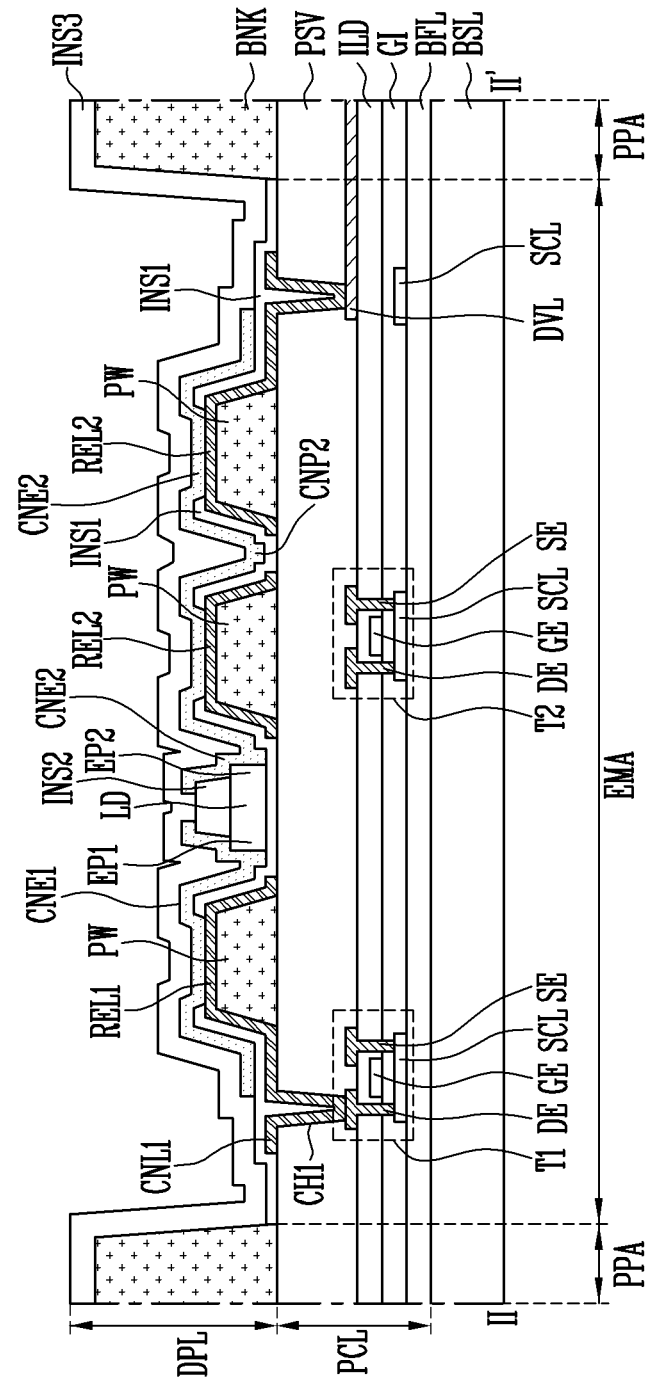
FIG. 8 is a cross-sectional view taken along the line II-II' of FIG. 7.
Figure 9A:
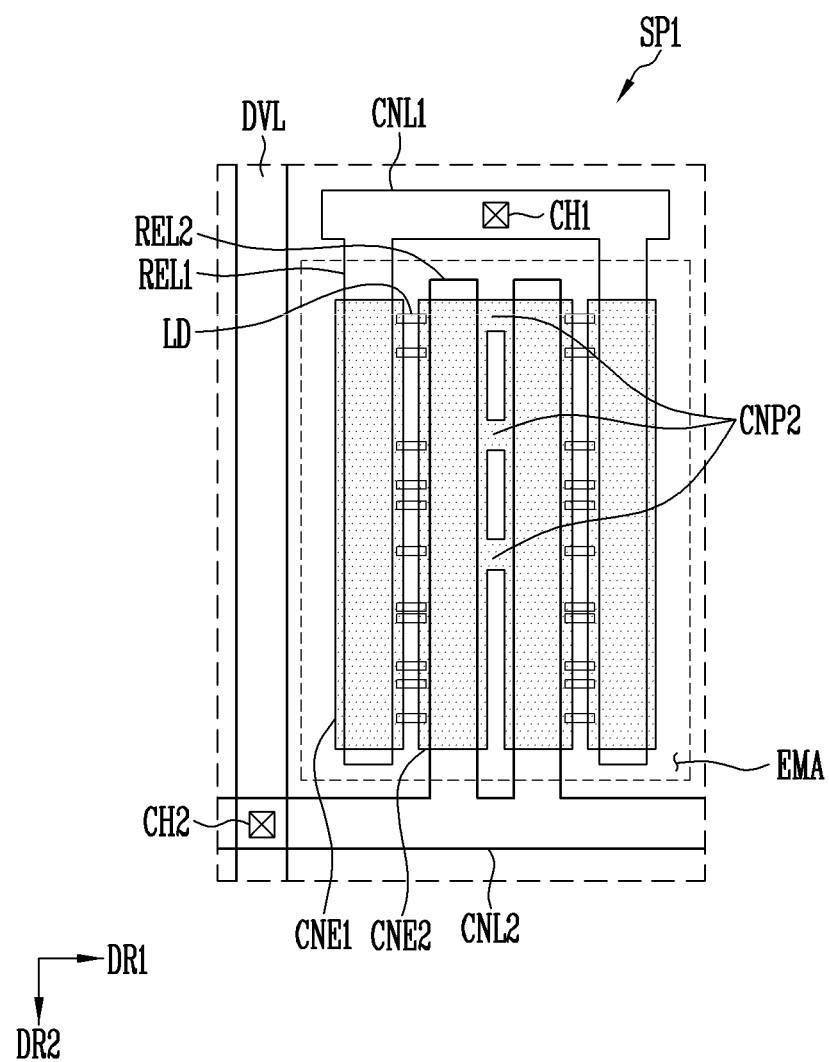
FIGS. 9A to 9D are plan views of a sub-pixel of FIG. 7 showing various shapes of a second connection pattern.
Figure 9B:
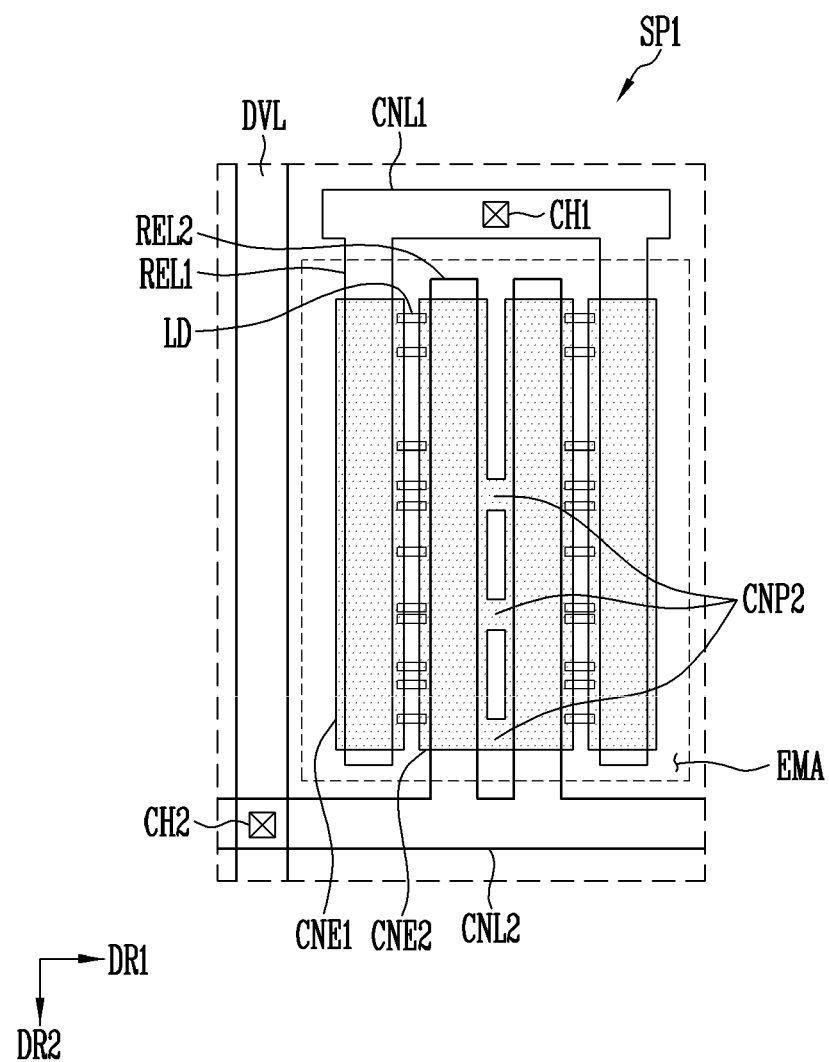
Figure 9C:
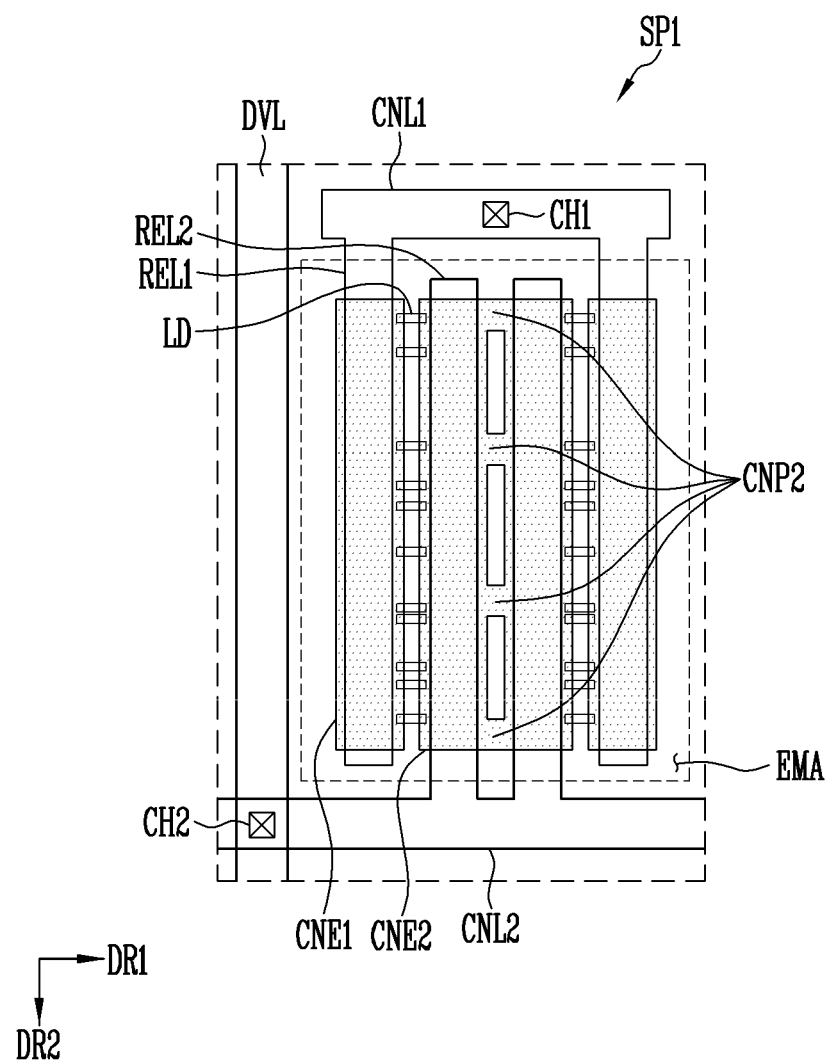
Figure 9D:
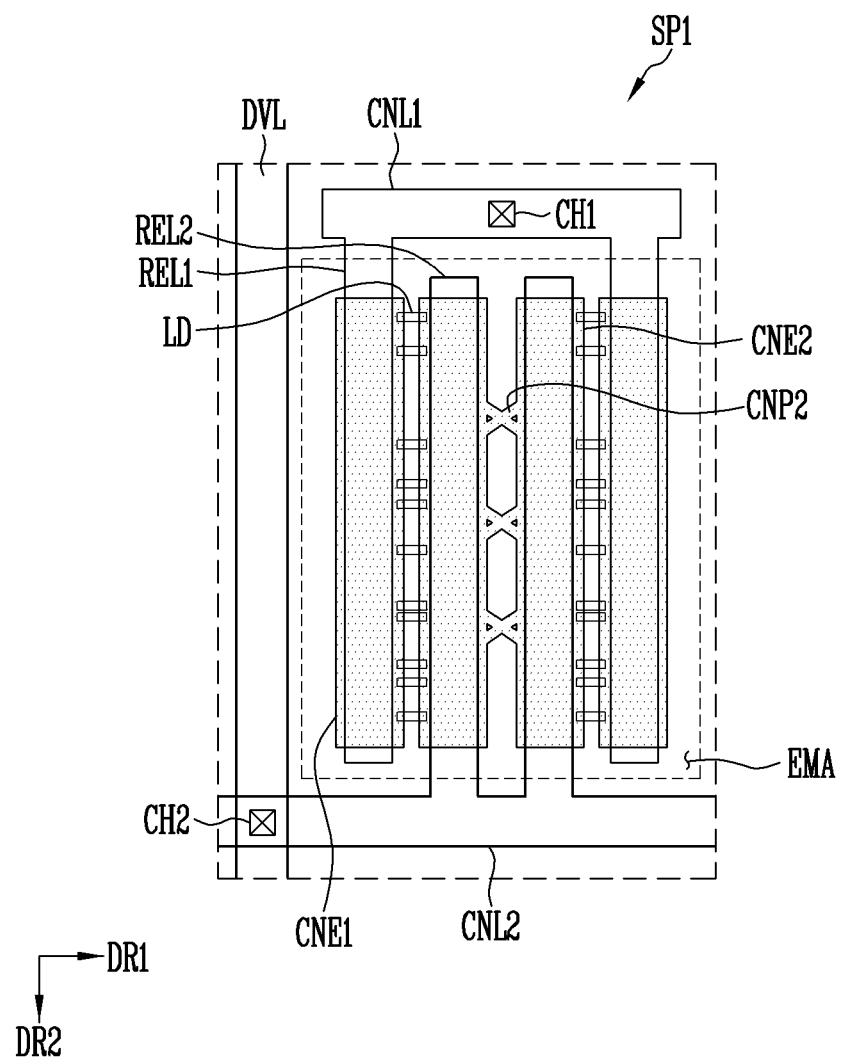

FIG. 7 is a plan view schematically illustrating first to third sub-pixels included in one of the pixels illustrated in FIG. 2 in accordance with another embodiment of the present disclosure; and FIG. 8 is a cross-sectional view taken along the line II-II' of FIG. 7. FIGS. 9A to 9D are plan views of a sub-pixel of FIG. 7 showing various shapes of a second connection pattern.

As illustrated in FIGS. 7 and 8, the second electrode patterns of the second contact electrode CNE2 may be coupled through the second connection pattern CNP2. In an embodiment, the second electrode patterns of the second contact electrode CNE2 and the second connection pattern CNP2 may be formed integrally with each other. As illustrated in FIGS. 9A to 9D, a plurality of second connection patterns CNP2 may be provided.

In an embodiment of the present disclosure, the first electrode patterns of one of the first electrode REL1 and the second electrode REL2 may be coupled through at least one first connection pattern CNP1. The second electrode patterns of one of the first contact electrode CNE1 and the second contact electrode CNE2 may be coupled through at least one second connection pattern CNP2.

Figure 10A:
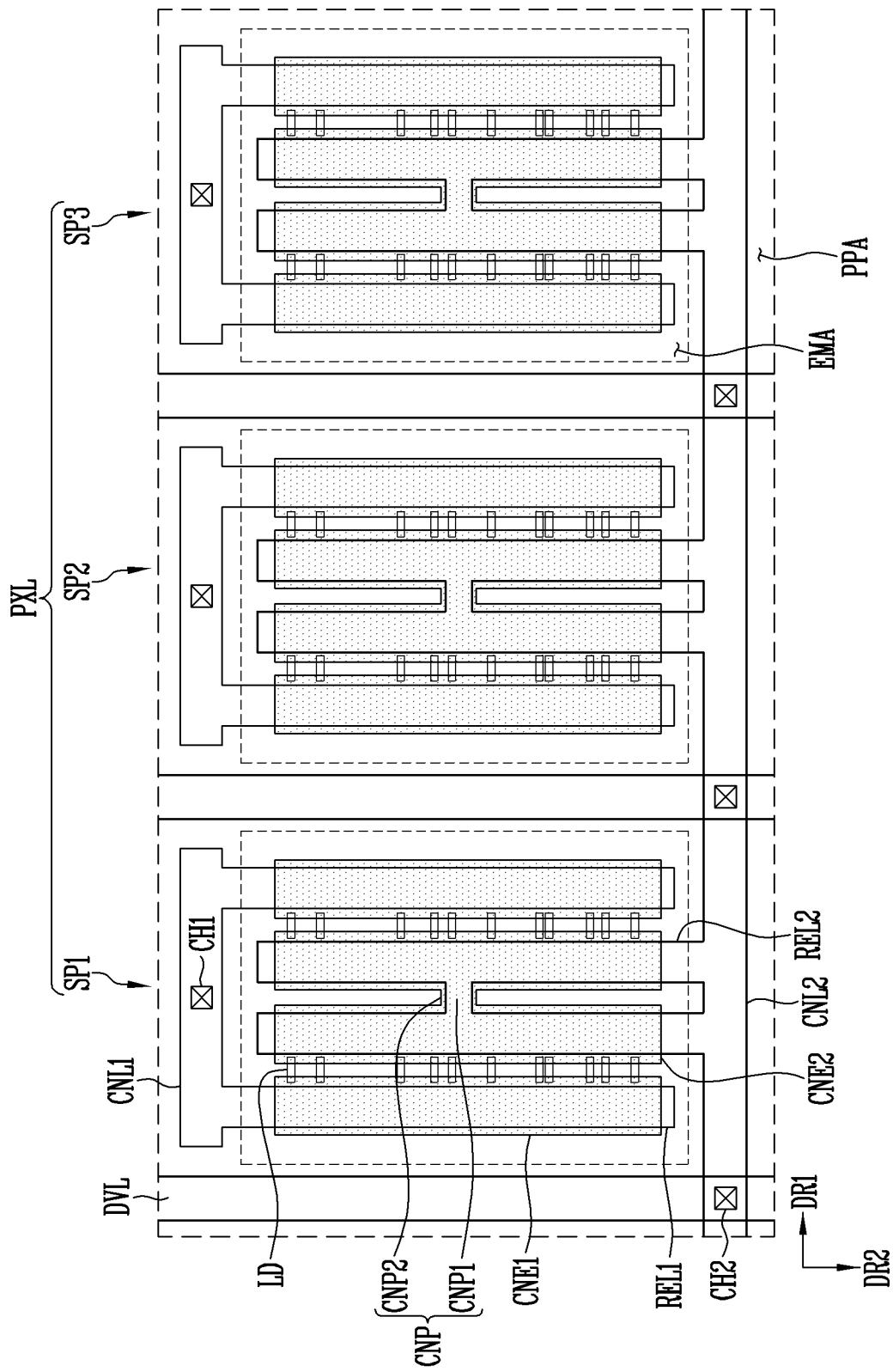
FIG. 10A is a plan view schematically illustrating first to third sub-pixels included in one of the pixels illustrated in FIG. 2 in accordance with another embodiment of the present disclosure.
Figure 10B:
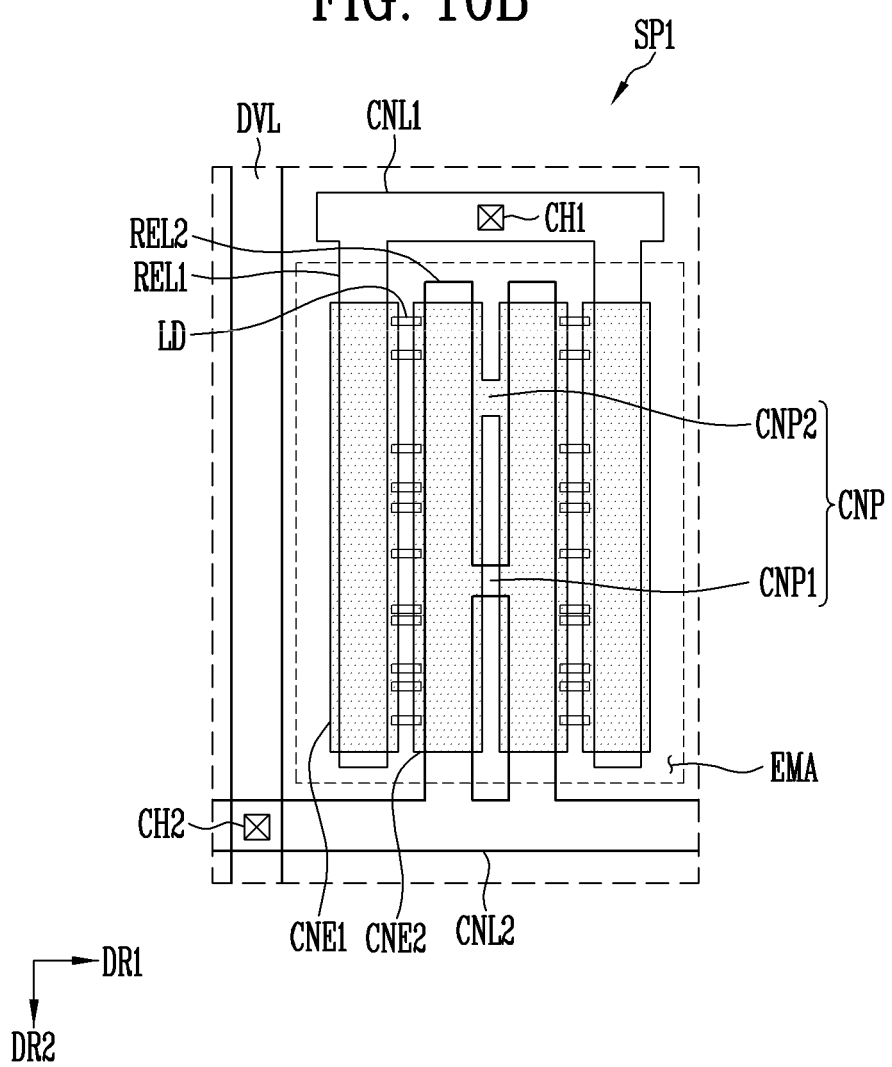
FIGS. 10B and 10C are plan views of a sub-pixel of FIG. 10A in which first and second connection patterns are spaced apart from each other.
Figure 10C:
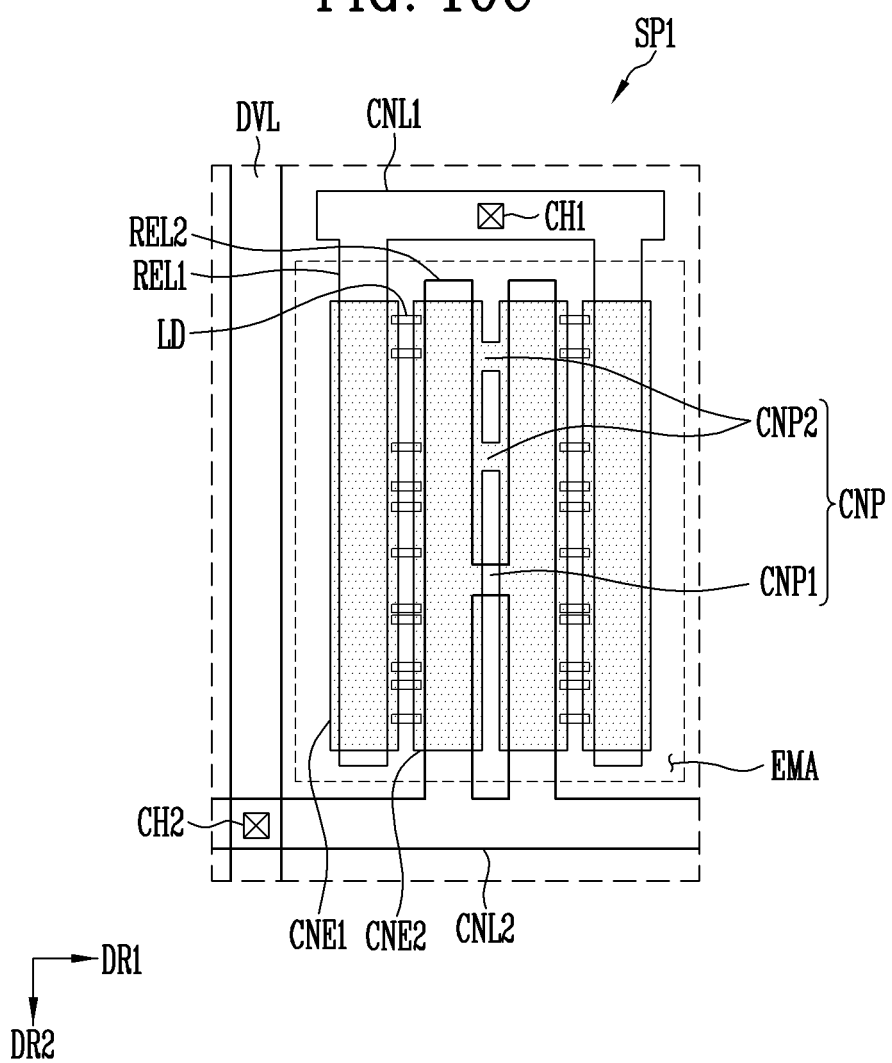

FIG. 10A is a plan view schematically illustrating first to third sub-pixels included in one of the pixels illustrated in FIG. 2 in accordance with another embodiment of the present disclosure; and FIGS. 10B and 10C are plan views of a sub-pixel of FIG. 10A in which first and second connection patterns are spaced apart from each other.

As illustrated in FIGS. 10A and 10B, the first electrode patterns of the second electrode REL2 may be coupled through the first connection pattern CNP1, and the second electrode patterns of the second contact electrode CNE2 may be coupled through the second connection pattern CNP2.

As illustrated in FIG. 10A, in an embodiment, the first connection pattern CNP1 and the second connection pattern CNP2 may completely overlap with each other, or at least partially overlap with each other. As illustrated in FIG. 10B, the first connection pattern CNP1 and the second connection pattern CNP2 may be spaced apart from each other rather than overlapping with each other. Further, as illustrated in FIG. 10C, the number of first connection patterns CNP1 and the number of second connection patterns CNP2 may differ from each other.

At least one first connection pattern CNP1 may couple the first electrode patterns of the first electrode REL1. In this case, a sub-pixel may be repaired by cutting off a portion of the first electrode REL1.

Figure 11:
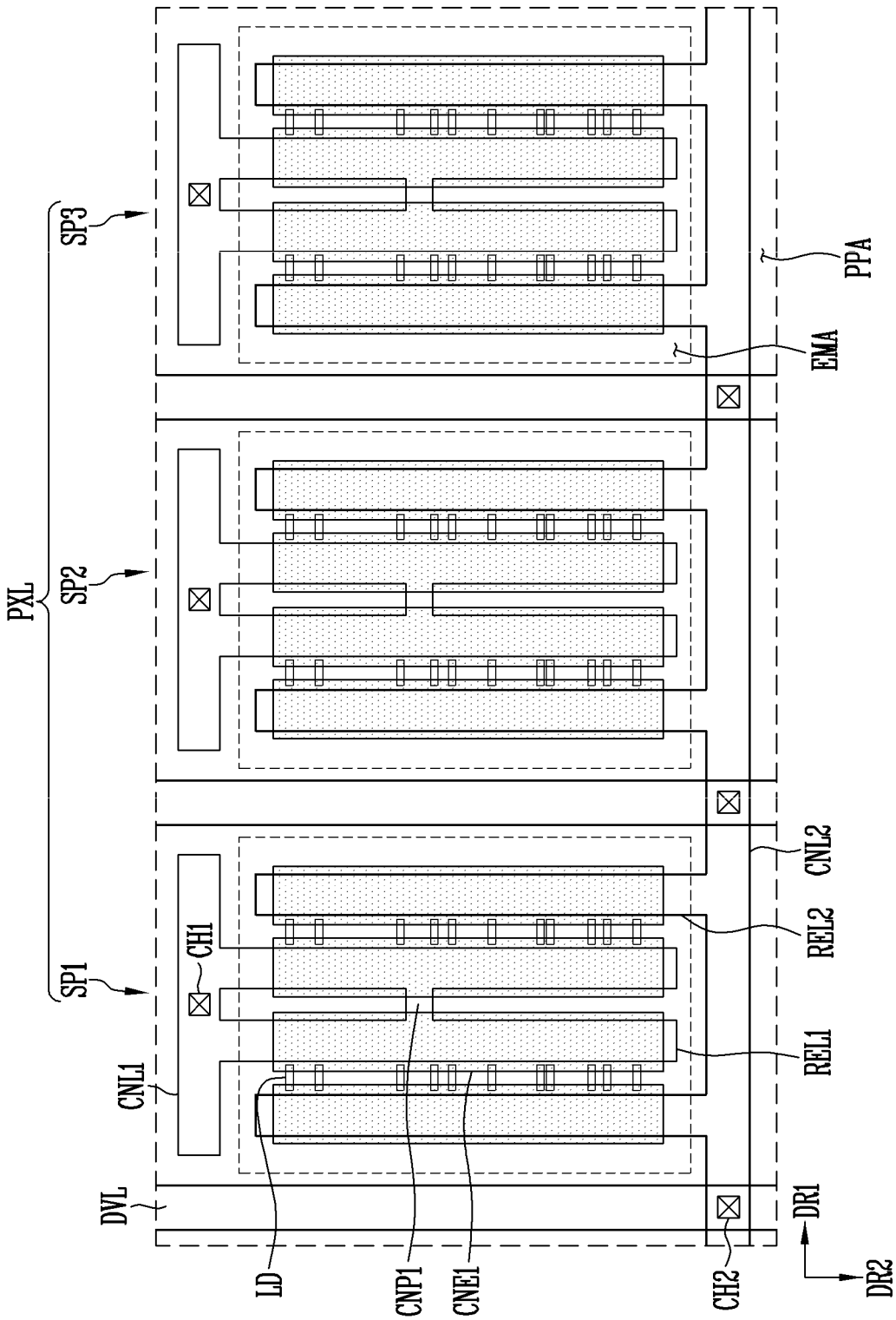
FIG. 11 is a plan view schematically illustrating first to third sub-pixels included in one of the pixels illustrated in FIG. 2 in accordance with a modification of an embodiment of the present disclosure.
Figure 12A:
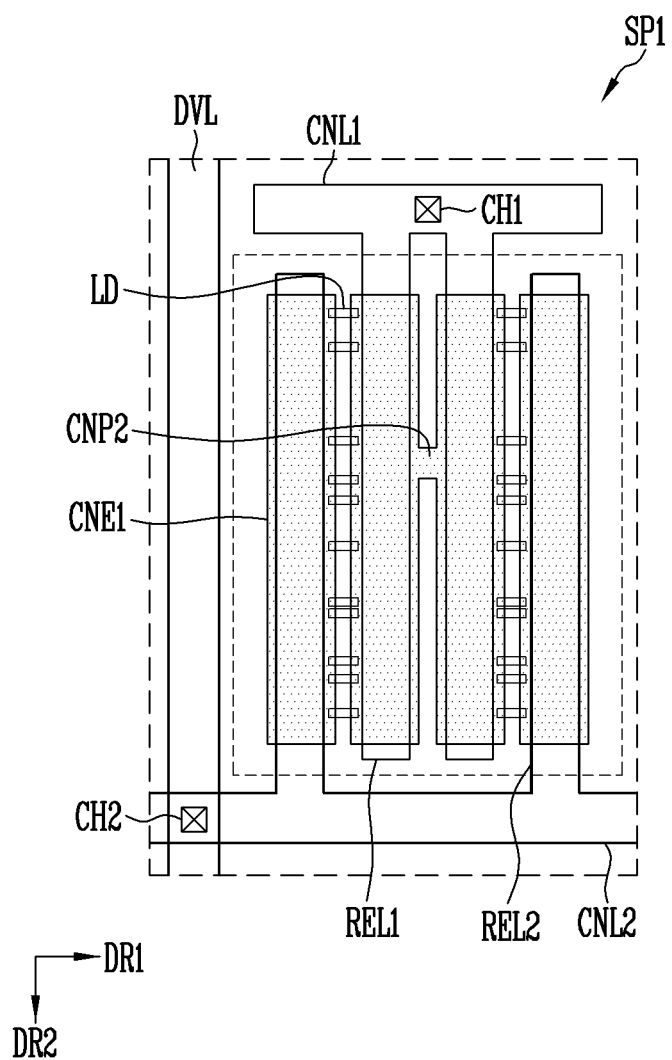
FIGS. 12A and 12B are plan views of a sub-pixel of FIG. 11 showing various shapes of a connection pattern.
Figure 12B:
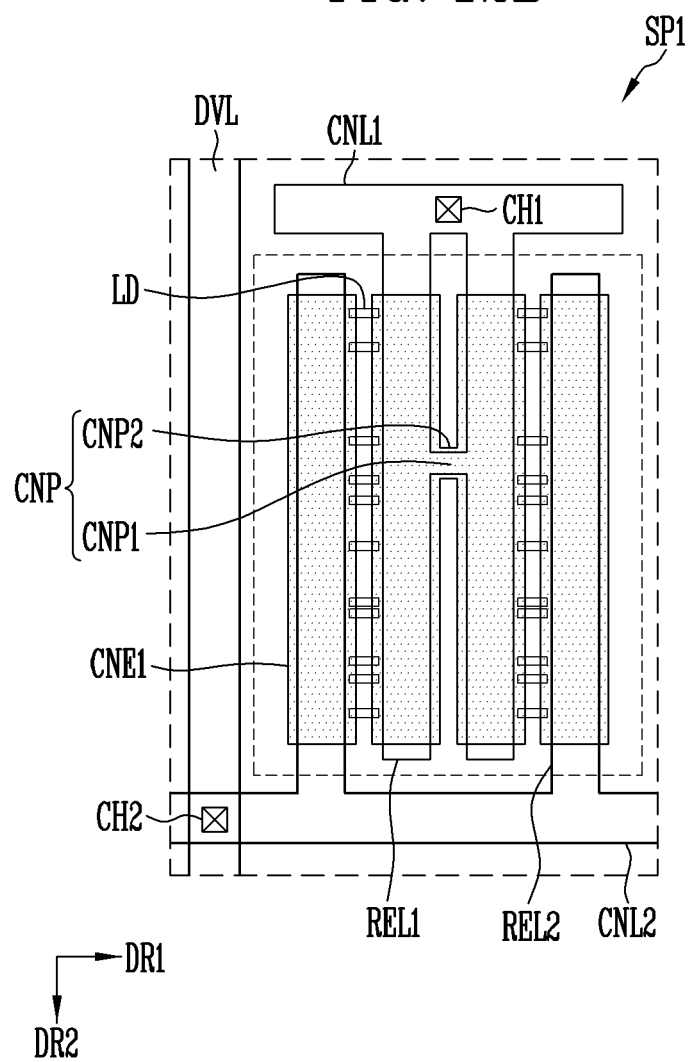

FIG. 11 is a plan view schematically illustrating first to third sub-pixels included in one of the pixels illustrated in FIG. 2 in accordance with a modification of an embodiment of the present disclosure; and FIGS. 12A and 12B are plan views of a sub-pixel of FIG. 11 showing various shapes of a connection pattern.

As illustrated in FIG. 11, the first connection pattern CNP1 disposed in the emission area EMA may couple the first electrode patterns of the first electrode REL1. In an embodiment, the first connection pattern CNP1 may be integrally formed with the first electrode patterns of the first electrode REL1.

In this case, the first electrodes REL1 may be disposed between the second electrodes REL2. In a case in which a defective light emitting element is detected, a portion of the first electrode REL1 that is coupled with the defective light emitting element may be disconnected (open). In this case, even when the portion of the first electrode REL1 is disconnected (open), the other portion of the first electrode REL1 may be coupled by the first connection pattern CNP1, such that the number of light emitting elements LD that do not emit may be minimized or reduced.

As illustrated in FIG. 12A, the first contact electrode CNE1 may include the second electrode patterns, such that the second electrode patterns of the first contact electrode CNE1 can be integrated with the second connection pattern CNP2. As illustrated in FIG. 12B, the first electrode patterns of the first electrode REL1 may be coupled through the first connection pattern CNP1, and the second electrode patterns of the first contact electrode CNE1 may be coupled through the second connection pattern CNP2.

Here, the first connection pattern CNP1 and the second connection pattern CNP2 may be spaced apart from each other not to overlap with each other. In an embodiment, the number of first connection patterns CNP1 and the number of second connection patterns CNP2 may differ from each other.

In the display device according to the present disclosure, when the sub-pixels SP1 to SP3 in which defective light emitting elements DLD are disposed are repaired, some of the first electrodes REL1 and the first contact electrodes CNE1 or the second electrodes REL2 and the second contact electrodes CNE2 that are coupled through at least one of the first and second connection patterns CNP1 and CNP2 may be open, such that the number of light emitting elements LD that do not emit light may be minimized or reduced.

For example, in a case in which the first connection pattern CNP1 directly couples the first electrode patterns of the first electrode REL1 or the second connection pattern CNP2 is formed integrally with the second electrode patterns of the first contact electrode CNE1 such that the first electrode patterns of the first electrode REL1 are indirectly coupled by the second connection patterns CNP2, peripherals of the first electrode REL1 that are coupled with defective light emitting elements DLD may be open. In contrast, in a case in which the first connection pattern CNP1 directly couples the first electrode patterns of the second electrode REL2 or the second connection pattern CNP2 is formed integrally with the second electrode patterns of the second contact electrode CNE2 such that the first electrode patterns of the second electrode REL2 are indirectly coupled, peripherals of the second electrode REL2 that are coupled with defective light emitting elements DLD may be open.

Herein, a method of repairing the display device in accordance with an embodiment of the present disclosure will be described in further detail with reference to the drawings.

Figure 13A:
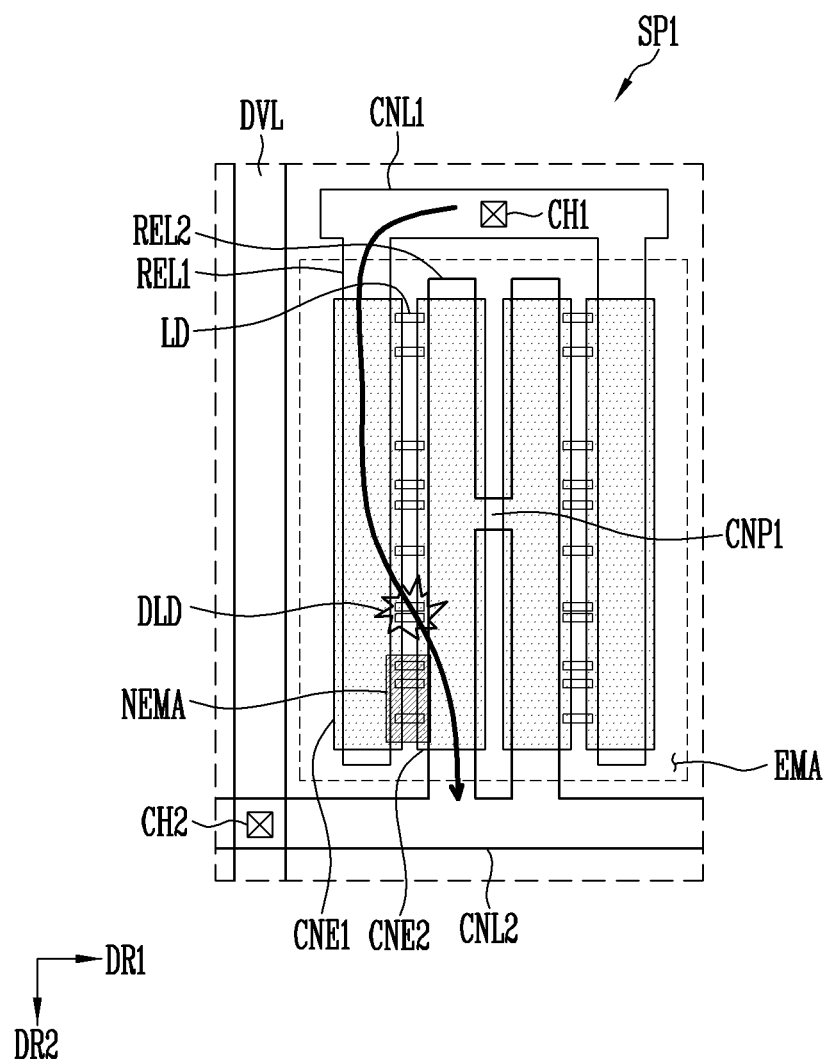
FIG. 13A is a view illustrating a defect caused by a defective light emitting element in accordance with an embodiment of the present disclosure, and illustrates only a sub-pixel of a pixel illustrated in FIG. 2.
Figure 13B:
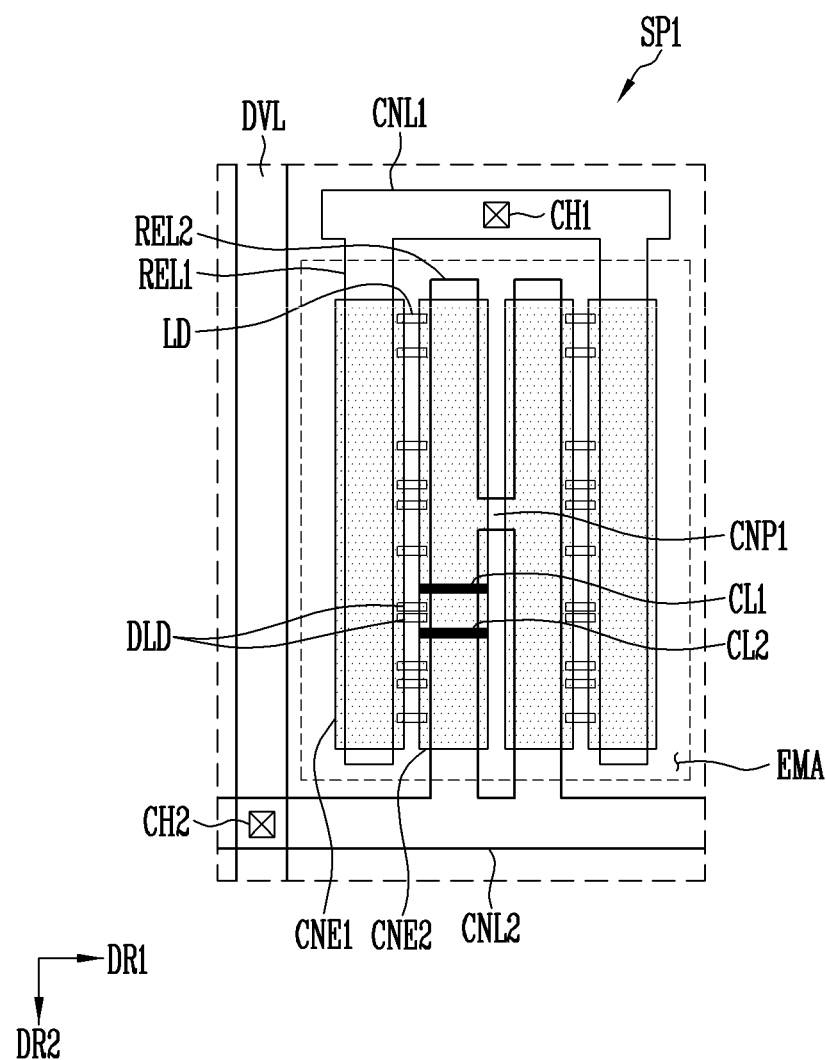
FIG. 13B is a diagram illustrating a repair method of FIG. 13A.
Figure 13C:
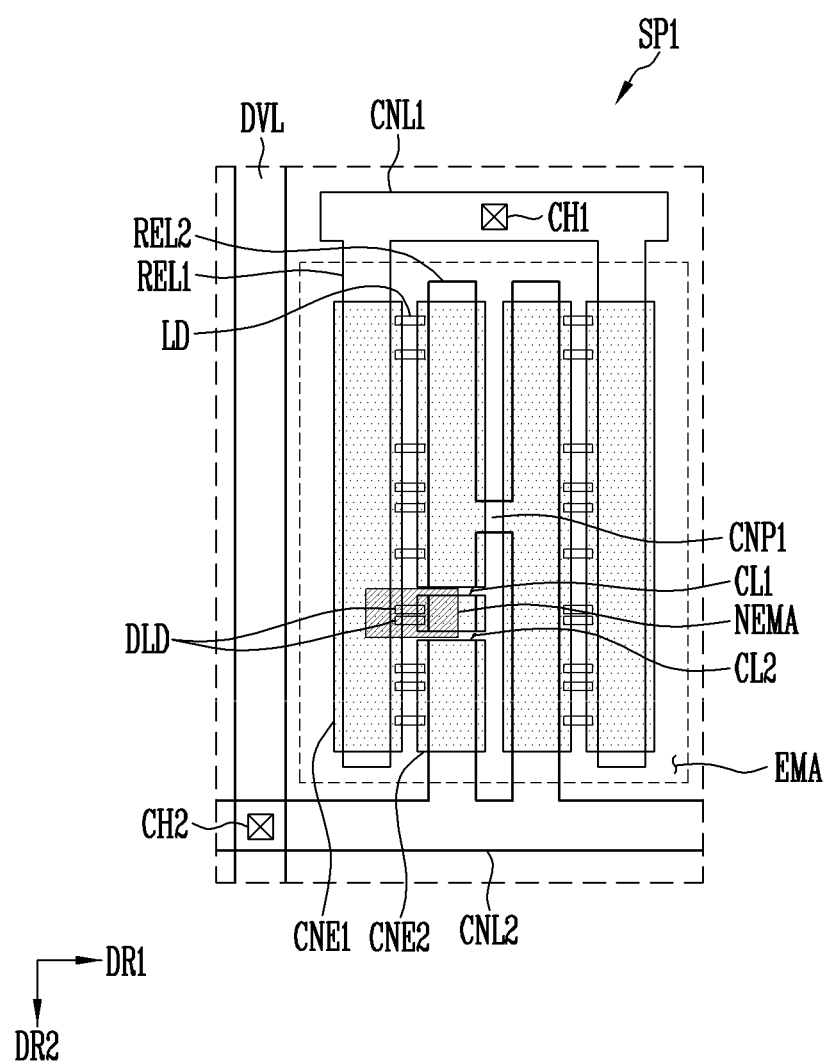
FIG. 13C is a diagram of FIG. 13B illustrating an emission area after a repair operation.

FIG. 13A is a view illustrating a defect caused by a defective light emitting element in accordance with an embodiment of the present disclosure, and illustrates only a sub-pixel of a pixel illustrated in FIG. 2; FIG. 13B is a diagram illustrating a repair method of FIG. 13A; and FIG. 13C is a diagram of FIG. 13B illustrating an emission area after a repair operation.

As illustrated in FIG. 13A, in a case in which some light emitting elements LD among a plurality of light emitting elements LD disposed in a sub-pixel are defective light emitting elements DLD, the first electrode REL1 and the second electrode REL2 may be short-circuited by the defective light emitting elements DLD. In this case, signals cannot be transmitted through the first contact hole (CH1 of FIG. 4) to some light emitting elements LD disposed in parallel with the defective light emitting elements DLD.

In further detail, as illustrated, signals may not be transmitted through the first contact hole (CH1 of FIG. 4) to light emitting elements LD that are disposed closer to a distal end of the first electrode REL1 than are the defective light emitting elements DLD. Therefore, an area including the light emitting elements LD to which signals cannot be transmitted through the first contact hole (CH1 of FIG. 4) may be a non-emission area NEMA.

In an embodiment of the present disclosure, as illustrated in FIG. 13B, a portion of the first electrode pattern coupled to the first connection pattern CNP1 among first ends of the defective light emitting elements DLD may be disconnected (open), such that defects of the sub-pixel attributable to the defective light emitting elements DLD can be repaired.

For example, as shown in the drawings, in a case in which the first electrode patterns of the second electrode REL2 are coupled through the first connection pattern CNP1, the location of the defective light emitting elements DLD is checked, and then a portion of the second electrode REL2 is cut off through a process such as a laser cutting process.

In further detail, a first cutting line CL1 is formed on the second contact electrode CNE2 that couples the second electrode REL2 with one end of the opposite ends of each defective light emitting element DLD. A second cutting line CL2 is formed on the second contact electrode CNE2 at a position spaced apart from the first cutting line CL1. Here, a junction between the defective light emitting elements DLD and the second contact electrode CNE2 is disposed between the first cutting line CL1 and the second cutting line CL2. When, as described above, the first cutting line CL1 and the second cutting line CL2 are formed on the second contact electrode CNE2, the second electrode REL2 under the second contact electrode CNE2 may also be cut.

Although not illustrated, in a case in which the first electrode REL1 corresponds to first electrode patterns coupled through the first connection pattern CNP1, the location of the defective light emitting elements DLD is checked, and then a portion of the first electrode REL1 may be cut off through a process such as a laser cutting process.

In further detail, the first cutting line CL1 is formed on the first contact electrode CNE1 that couples the first electrode REL1 with one end of the opposite ends of each defective light emitting element DLD. The second cutting line CL2 is formed on the first contact electrode CNE1 at a position spaced apart from the first cutting line CL1. Here, a junction between the defective light emitting elements DLD and the first contact electrode CNE1 is disposed between the first cutting line CL1 and the second cutting line CL2. When, as described above, the first cutting line CL1 and the second cutting line CL2 are formed on the first contact electrode CNE1, the first electrode REL1 under the first contact electrode CNE1 may also be cut.

Therefore, in the repair method of the display device in accordance with an embodiment of the present disclosure, the first electrode REL1 and the first contact electrode CNE1 or the second electrode REL2 and the second contact electrode CNE2 in an area coupled with the defective light emitting elements DLD may float. Therefore, signals of the pixel circuit layer cannot be transmitted to only the defective light emitting elements DLD, such that only an area where the defective light emitting elements DLD are disposed is a non-emission area NEMA, and the other light emitting elements LD may receive the signals of the pixel circuit layer through the connection pattern CNP and normally emit light. Consequently, the size of a non-emission area formed by a repair may be minimized.

Although some embodiments of the present disclosure have been disclosed, those skilled in the art will appreciate that the present disclosure can be implemented in various other forms, without departing from the scope and spirit of the disclosure as disclosed in the accompanying claims.

Therefore, it should be understood that the embodiments are only for illustrative purposes and do not limit the bounds of the present invention.

The invention claimed is:

1. A display device comprising:
a base layer including a display area and a non-display area; and
a plurality of pixels in the display area, and each comprising a plurality of sub-pixels each including an emission area configured to emit light and a peripheral area around the emission area,
wherein the sub-pixels comprise:
at least one first electrode and at least one second electrode extending in a first direction and spaced apart from each other in a second direction crossing the first direction, each of the first direction and the second direction crossing a direction in which an upper surface of the base layer faces; and
a plurality of light emitting elements between a first electrode of the at least one first electrode and a second electrode of the at least one second electrode and configured to emit light,
wherein at least one of the at least one first electrode and the at least one second electrode comprises at least two first electrode patterns spaced apart from each other in the second direction, and the at least two first electrode patterns are coupled by at least one first connection pattern in the emission area, the at least one first connection pattern located between a light emitting element of the plurality of light emitting elements and another light emitting element of the plurality of light emitting elements along the first direction.

2. The display device according to claim 1,
wherein the first electrode is between two second electrodes of the at least one second electrode adjacent to each other, and
wherein the first electrode includes the first electrode patterns.

3. The display device according to claim 1,
wherein the second electrode is between two first electrodes of the at least one first electrode adjacent to each other, and
wherein the second electrode includes the first electrode patterns.

4. The display device according to claim 1, wherein the first connection pattern is formed integrally with the first electrode patterns.

5. The display device according to claim 1, further comprising:
a first contact electrode extending along the first electrode, and configured to couple the first electrode with an end of opposite ends of the light emitting element; and
a second contact electrode extending along the second electrode, and configured to couple the second electrode with another end of the opposite ends of the light emitting element,
wherein at least one of the first contact electrode and the second contact electrode comprises at least two second electrode patterns spaced apart from each other, and the second electrode patterns are coupled by at least one second connection pattern.

6. The display device according to claim 5, wherein the second connection pattern is formed integrally with one of the first contact electrode and the second contact electrode.

7. The display device according to claim 6,
wherein the second connection pattern is formed integrally with the first contact electrode, and
wherein the first electrode is between the second connection pattern and the light emitting elements.

8. The display device according to claim 6,
wherein the second connection pattern is formed integrally with the second contact electrode, and
wherein the second electrode is between the second connection pattern and the light emitting elements.

9. The display device according to claim 5, wherein the first connection pattern and at least a portion of the second connection pattern overlap with each other.

10. The display device according to claim 5, wherein the first connection pattern and the second electrode pattern are spaced apart from each other.

11. The display device according to claim 5, wherein a number of first connection patterns and a number of second connection patterns differ from each other.

12. A display device comprising:
a base layer including a display area and a non-display area; and
a plurality of pixels in the display area, and each comprising a plurality of sub-pixels each including an emission area configured to emit light and a peripheral area around the emission area,
wherein the sub-pixels comprise:
at least one first electrode and at least one second electrode extending in a direction and spaced apart from each other;
a plurality of light emitting elements between the first electrode and the second electrode and configured to emit light;
a first contact electrode extending along the first electrode and configured to couple the first electrode with an end of opposite ends of the light emitting element; and
a second contact electrode extending along the second electrode, and configured to couple the second electrode with another end of the opposite ends of the light emitting element,
wherein at least one of the first electrode and the second electrode comprises at least two first electrode patterns spaced apart from each other, and
wherein at least one of the first contact electrode and the second contact electrode comprises at least two second electrode patterns spaced apart from each other, and the second electrode patterns are coupled by at least one connection pattern in the emission area.

13. The display device according to claim 12,
wherein the connection pattern is formed integrally with the first contact electrode, and
wherein the first electrode is between the connection pattern and the light emitting elements.

14. The display device according to claim 12,
wherein the connection pattern is formed integrally with the second contact electrode, and
wherein the second electrode is between the connection pattern and the light emitting elements.

15. A method of repairing a display device,
the display device comprising:
a base layer including a display area and a non-display area; and
a plurality of pixels in the display area, and each comprising a plurality of sub-pixels each including an emission area configured to emit light and a peripheral area around the emission area, wherein the plurality of pixels comprises:
- a first electrode and a second electrode extending in a first direction and spaced apart from each other in a second direction crossing the first direction, each of the first direction and the second direction crossing a direction in which an upper surface of the base layer faces; and
- a plurality of light emitting elements-between the first electrode and the second electrode and configured to emit light,
- wherein at least one of the first electrode and the second electrode includes two electrode patterns spaced apart from each other in the second direction, and the electrode patterns are coupled by at least one connection pattern in the emission area,
- the method comprising separating a first region of an electrode pattern of the electrode patterns coupled with a normal light emitting element of the plurality of light emitting elements from a second region of the electrode pattern coupled with a defective light emitting element of the plurality of light emitting elements, the normal light emitting element and the defective light emitting element being spaced apart in the first direction.

16. The method according to claim 15, wherein separating the electrode pattern comprises, when a contact electrode couples the electrode pattern with one end of opposite ends of the light emitting element,
- separating the contact electrode coupled to the normal light emitting element of the plurality of light emitting elements from the contact electrode coupled to the defective light emitting element.

17. The method according to claim 16, comprising, when the first electrode includes the electrode patterns:
- forming a first cutting line on a first contact electrode configured to couple the first electrode with one end of opposite ends of the light emitting element; and
- forming, on the first contact electrode, a second cutting line to be spaced apart from the first cutting line,
- wherein a junction between the defective light emitting element and the first contact electrode is between the first cutting line and the second cutting line.

18. The method according to claim 17, wherein the first cutting line and the second cutting line are formed on the first electrode.

19. The method according to claim 16, comprising, when the second electrode includes the electrode patterns:
- forming a first cutting line on a second contact electrode configured to couple the second electrode with one end of opposite ends of the light emitting element; and
- forming, on the second contact electrode, a second cutting line to be spaced apart from the first cutting line,
- wherein a junction between the defective light emitting element and the second contact electrode is between the first cutting line and the second cutting line.

20. The method according to claim 19, wherein the first cutting line and the second cutting line are formed on the second electrode.

* * * * *